(12) United States Patent
Chung et al.

(10) Patent No.: US 11,437,458 B2
(45) Date of Patent: Sep. 6, 2022

(54) DISPLAY DEVICE WITH SUBSTRATE AND LIGHT-SHIELD HAVING HOLE FOR SENSOR

(71) Applicant: Samsung Display Co., Ltd., Yongin-si (KR)

(72) Inventors: Jinkoo Chung, Yongin-si (KR); Beohmrock Choi, Yongin-si (KR); Seongmin Kim, Yongin-si (KR); Seungin Baek, Yongin-si (KR); Sanggu Lee, Yongin-si (KR); Kyungsoo Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 234 days.

(21) Appl. No.: 16/807,833

(22) Filed: Mar. 3, 2020

(65) Prior Publication Data
US 2020/0373372 A1 Nov. 26, 2020

(30) Foreign Application Priority Data
May 23, 2019 (KR) .......................... 10-2019-0060807

(51) Int. Cl.
*H01L 27/32* (2006.01)
*H01L 51/00* (2006.01)

(52) U.S. Cl.
CPC ...... *H01L 27/3272* (2013.01); *H01L 27/3246* (2013.01); *H01L 27/3258* (2013.01); *H01L 27/3276* (2013.01); *H01L 51/0097* (2013.01); *H01L 27/3211* (2013.01)

(58) Field of Classification Search
CPC ............. H01L 27/3272; H01L 27/3246; H01L 27/3258; H01L 51/0097; H01L 27/3276; H01L 27/3211
See application file for complete search history.

(56) References Cited

U.S. PATENT DOCUMENTS

| | | | |
|---|---|---|---|
| 9,761,647 B2 | 9/2017 | Lee et al. | |
| 10,079,368 B2 | 9/2018 | Lee et al. | |
| 11,005,079 B2 * | 5/2021 | Tang | H01L 51/5284 |

(Continued)

FOREIGN PATENT DOCUMENTS

| | | |
|---|---|---|
| JP | 2013-084477 | 5/2013 |
| JP | 2017-151339 | 8/2017 |

(Continued)

*Primary Examiner* — Lex H Malsawma
(74) *Attorney, Agent, or Firm* — Kile Park Reed & Houtteman PLLC

(57) ABSTRACT

A display device including a display area and a sensor area which includes a transmission part comprises a substrate, display elements disposed on the substrate and including a first display element and a second display element spaced apart from each another with the transmission part therebetween, pixel circuits including a first pixel circuit electrically connected to the first display element and a second pixel circuit electrically connected to the second display element, and a light-shielding layer including a part overlapping the first pixel circuit and the second pixel circuit and the light-shielding layer includes a hole corresponding to the transmission part, the width of the hole of the light-shielding layer is less than a separation distance between the first display element and the second display element.

35 Claims, 19 Drawing Sheets

(56) References Cited

U.S. PATENT DOCUMENTS

| | | | |
|---|---|---|---|
| 2007/0205420 A1* | 9/2007 | Ponjee | H01L 27/3269 257/80 |
| 2016/0172633 A1* | 6/2016 | Ahn | H01L 51/524 257/40 |
| 2017/0250240 A1 | 8/2017 | Lee et al. | |
| 2018/0190944 A1 | 7/2018 | Lee et al. | |
| 2020/0105844 A1* | 4/2020 | Wang | H01L 27/3272 |

FOREIGN PATENT DOCUMENTS

| | | |
|---|---|---|
| KR | 10-2017-0074252 | 6/2017 |
| KR | 10-2018-0079097 | 7/2018 |

* cited by examiner

DISPLAY DEVICE WITH SUBSTRATE AND LIGHT-SHIELD HAVING HOLE FOR SENSOR

CROSS-REFERENCE TO RELATED APPLICATIONS

This application claims priority to and benefits of Korean Patent Application No. 10-2019-0060807 under 35 U.S.C. § 119, filed in the Korean Intellectual Property Office on May 23, 2019, the entire contents of which are incorporated herein by reference.

BACKGROUND

1. Technical Field

One or more embodiments relate to a display device, and to a display device having a sensor area.

2. Description of Related Art

In display devices, there is an increasing demand for enlarging a display area in which an image is output. For example, it is becoming more necessary for a display device to output an image from a larger area of a front surface (and/or side surfaces) in contrast to smaller areas of a display.

Display devices have been widely utilized in a variety of applications and have been designed to provide various functions in connection with sensors.

SUMMARY

For example, a display device needs a sensor area in which light can be output or received, in the vicinity of an area in which a sensor is positioned. The sensor area may be inside the display area as the display area increases. The display device may have a transmission part having no pixels in at least a part of the sensor area. Thus, the performance of the sensor may not be deteriorated due to light output by a pixel.

When the display device includes the transmission part in the sensor area, light output from pixels adjacent to the transmission part in the sensor area may be refracted by the transmission part. Thus, image distortion may occur when an image is output from the display device.

One or more embodiments include a display device that may prevent deterioration of image output performance even when the sensor area may be inside the display area.

However, the above-described objective is an example, and the scope of the disclosure is not limited thereby.

Aspects will be set forth in part in the description which follows and, in part, will be apparent from the description, or may be learned by practice of the embodiments of the disclosure.

Thus, a display device having a variety of functions and improved quality may be provided. However, the above-described effects are exemplary, and the effects according to one or more embodiments will be described in detail with reference to the following description According to one or more embodiments, a display may include a display area and a sensor area inside the display area and the sensor area may include a transmission part, a plurality of display elements disposed on the substrate and including a first display element and a second display element spaced apart from each other with the transmission part therebetween, a plurality of pixel circuits including a first pixel circuit electrically connected to the first display element and a second pixel circuit electrically connected to the second display element, and a light-shielding layer including a part overlapping the first pixel circuit and the second pixel circuit and the light-shielding layer may include a hole corresponding to the transmission part, wherein the width of the hole of the light-shielding layer may be less than a separation distance between the first display element and the second display element.

The hole of the light-shielding layer may overlap the transmission part.

The encapsulation layer may be disposed facing the light-shielding layer.

The encapsulation layer may include inorganic encapsulation layers and an organic encapsulation layer between the inorganic encapsulation layers.

A protective film may include an opening corresponding to the sensor area.

For example, the substrate may include a first polymer resin layer and a second polymer resin layer, and the light-shielding layer may be between the first polymer resin layer and the second polymer resin layer.

The light-shielding layer may be between the substrate and a buffer layer.

The light-shielding layer may be between an insulating layer on the substrate and the encapsulation layer.

In another example, the light-shielding layer may be between the substrate and the plurality of pixel circuits.

At least one of the plurality of display elements may be positioned in the sensor area.

For example, the light-shielding layer may include a conductive material.

The light-shielding layer may be electrically connected to one among wirings applying voltages to the plurality of pixel circuits.

One among the wirings electrically connected to the light-shielding layer may include an initialization voltage line or a power supply line.

The display device may further include a planarization layer positioned on the plurality of pixel circuits and including an opening that corresponds to the transmission part, and the width of the hole of the light-shielding layer may be less than the width of the opening of the planarization layer.

The light-shielding layer may cover the entirety of the first pixel circuit and the second pixel circuit.

The plurality of display elements may include a plurality of pixels that may include a pixel electrode, an emission layer on the pixel electrode, and an opposite electrode on the emission layer, the opposite electrode is a single body corresponding to the plurality of display elements, and the opposite electrode may include an opening that corresponds to the transmission part.

The pixels may be auxiliary pixels or main pixels or a combination of auxiliary and main pixels.

The main pixels may be in the display area and the auxiliary pixels may be in the sensor area and the transmission part may be between the auxiliary and main pixels.

At least one auxiliary pixel may be included in an auxiliary pixel area of the sensor area and the sensor area may further include a transmission area that may include the transmission part.

The auxiliary pixel area may include red, green, and blue emission areas.

The emission areas may be Pentile or stripes.

The hole of the light-shielding layer may define the transmission part.

The transmission part may be of a rectangular shape or substantially circular in shape.

The light-shielding layer may include an absorbance material.

The display device may further include a component disposed under the substrate corresponding to the sensor area and may include an electronic element that emits and/or receives light.

According to another embodiment, a display device may include a display area and a sensor area which includes a transmission part. The display device may include a substrate, a plurality of display elements disposed on the substrate and including a first display element and a second display element spaced apart from each other with the transmission part therebetween, a light-shielding layer, and a component disposed in the sensor area.

An encapsulation layer may be disposed facing the light-shielding layer.

A first pixel circuit may be electrically connected to the first display element and a second pixel circuit may be electrically connected to the second display element and a planarization layer may be between the first pixel circuit and the first display element and between the second pixel circuit and the second display element and the planarization layer may include a first opening corresponding to the transmission part.

A pixel defining layer may face the planarization layer and the pixel defining layer may comprise an opening corresponding to the transmission part.

Each of the plurality of display elements may include a pixel electrode, an emission layer on the pixel electrode, and an opposite electrode on the emission layer, and the light-shielding layer may be between a pixel electrode of each of the display elements and an emission of each of the display elements and may include openings that overlap the pixel electrodes, and the width of the first hole of the light-shielding layer may be less than the width of the first opening of the planarization layer.

The light-shielding layer may comprise carbon black.

The opposite electrode may be a single body corresponding to the display elements, and include an opening corresponding to the transmission part. A width of the first hole of the light-shielding layer may be less than that of the opening of the opposite electrode or the planarization layer.

The display device may further comprise a pixel defining layer on the planarization layer, and the pixel defining layer comprises an opening corresponding to the transmission part.

The display device may further include a plurality of pixel circuits that comprise a first pixel circuit electrically connected to the first display element and a second pixel circuit electrically connected to the second display element, and the light-shielding layer may be between the substrate and the first pixel circuit and between the substrate and the second pixel circuit.

The light-shielding layer may include a conductive material.

The light-shielding layer may be electrically connected to one among wirings that applies voltages to the at least one of plurality of pixel circuits.

At least one of the plurality of display elements may overlap the component.

Other aspects, features, and advantages than the above description will be apparent from the following drawings, the claims, and a detailed description.

Thus, a display device having a variety of functions and improved quality may be provided. However, the above-described effects are an example, and the effects according to one or more embodiments will be described in detail with reference to the following description.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
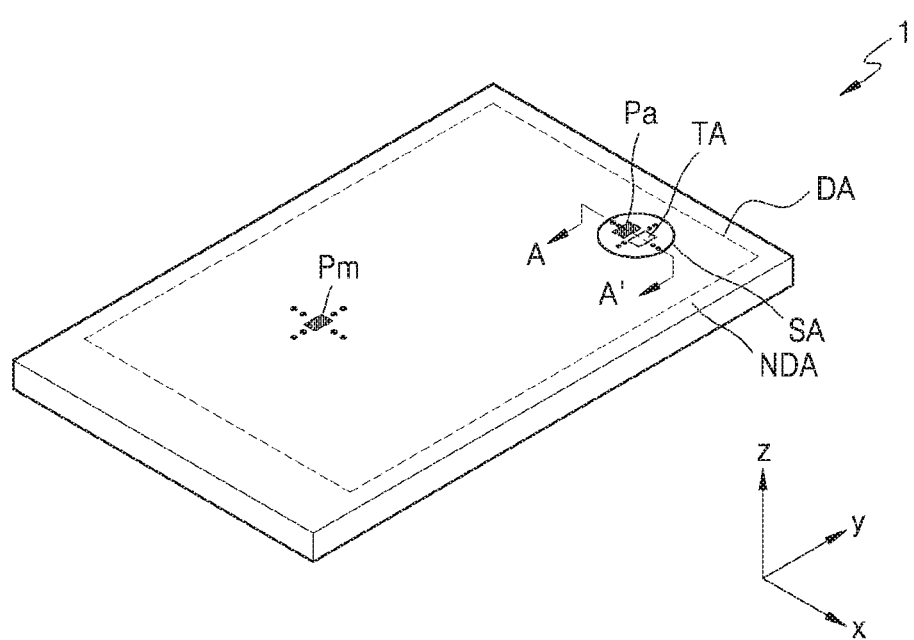
FIG. 1 is a perspective view illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described with reference to the accompanying drawings. In the description with reference to the attached drawings, like reference numerals are used for the same or corresponding elements, and a redundant description thereof will be omitted.

It will be understood that although the terms "first", "second", for example, may be used herein to describe various components, these components should not be limited by these terms. These components are used to distinguish one component from another. As used herein, the singular forms "a", "an" and "the" are intended to include the plural forms as well, unless the context clearly indicates otherwise.

It will be further understood that the terms "comprises" and/or "comprising" or "including" used to specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. For example, intervening layers, regions, or components may be present.

Sizes of elements in the drawings may be exaggerated for convenience of explanation or for clarity. In other words, since sizes and thicknesses of components in the drawings may be arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a process order may be performed differently from the described order. For example, two consecutively described processes may be performed substantially at the same time or performed in an order opposite to the described order.

FIG. 1 is a perspective view illustrating a display device 1 according to an embodiment.

Referring to FIG. 1, the display device 1 may include a display area DA, in which an image is realized, and a non-display area NDA, in which an image is not realized. The display device 1 may output an image (hereinafter, referred to as a 'main image') by using light emitted from pixels (hereinafter, referred to as main pixels Pm) positioned in the display area DA.

The display device 1 may include a sensor area SA. The sensor area SA may be inside the display area DA. The sensor area SA may include a transmission part TA through which light or/and sound may transmit.

Pixels (hereinafter, referred to as auxiliary pixels Pa) may be positioned in a part of the sensor area SA. In order to discriminate pixels positioned in the sensor area SA from pixels positioned in areas other than the sensor area SA, pixels positioned in the sensor area SA may be referred to as auxiliary pixels. The display device 1 may output an image (hereinafter, referred to as an 'auxiliary image') by using light emitted from the auxiliary pixels Pa.

For example, the resolution of the auxiliary image output from the sensor area SA may be lower than that of the main image output from the display area DA. Resolution that is an index for representing precision of an image may be defined as the number of pixels positioned per unit area. The sensor area SA may include the transmission part TA through which light and/or sound may transmit. Thus, the number of pixels that may be positioned per unit area, for example, the number of auxiliary pixels Pa, may be less than the number of pixels positioned in the display area DA per unit area, for example, the number of main pixels Pm.

The sensor area SA may be at least partially surrounded by the display area DA. In an embodiment, the sensor area SA may be entirely surrounded by the display area DA, as shown in FIG. 1.

Hereinafter, an organic light-emitting display device will be described as an example of the display device 1 according to an embodiment. However, the display device according to one or more embodiments is not limited thereto. In another embodiment, a display device according to the disclosure may be a variety of types of display devices, such as an inorganic electroluminescent (EL) display and a quantum dot light-emitting display. The display device 1 may be a cell phone, a smart watch, a note book, or the like within the spirit and the scope of the disclosure.

In FIG. 1, the sensor area SA may be at one side (a right upper side, for example) of the display area DA having a substantially rectangular shape. However, embodiments are not limited thereto. For example, the shape of the display area DA may be a circle, an oval, or a polygonal shape, such as a triangle or pentagonal shape. Other shapes of the display area DA are also possible and within the spirit and scope of the invention. The position and number of sensor areas SA may also vary.

Figure 2A:
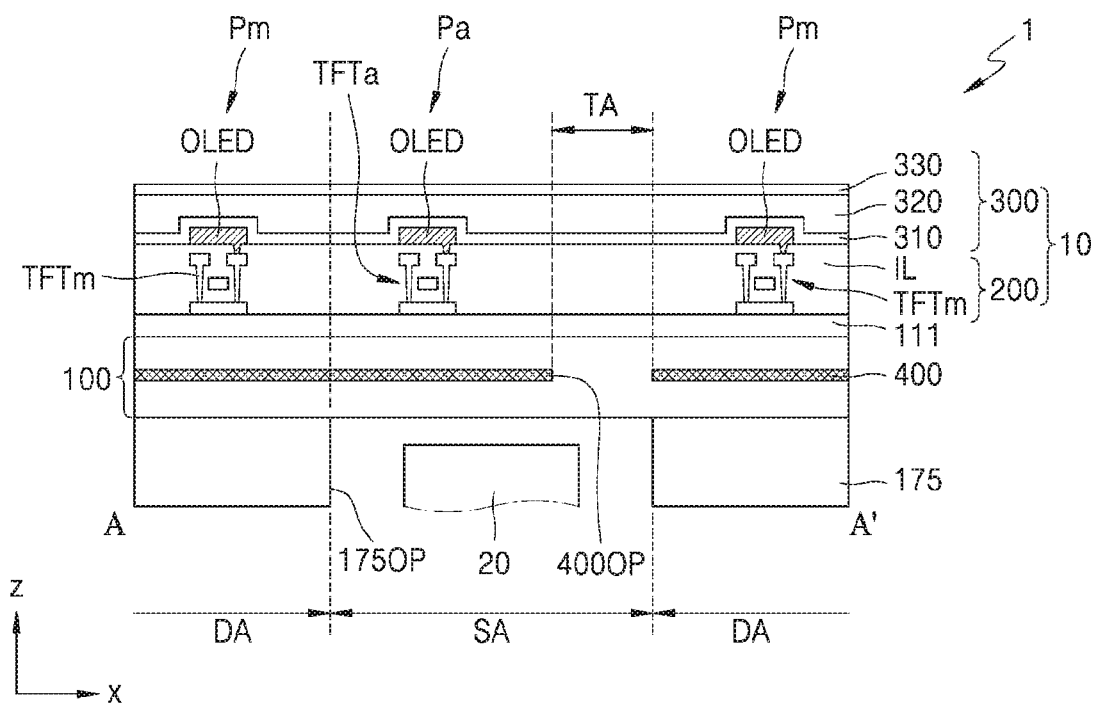
FIG. 2A is a schematic cross-sectional view illustrating the display device according to an embodiment.

FIG. 2A is a schematic cross-sectional view illustrating a display device 1 according to an embodiment. FIG. 2A may correspond to a cross-section taken along a line A-A' of FIG. 1.

Referring to FIG. 2A, the display device 1 may include a display panel 10 having pixels and a component 20 that may be positioned below the display panel 10 and corresponds to the sensor area SA. For example, the sensor area SA may refer to a component area that corresponds to an area in which a component may be positioned.

The display panel 10 may include a substrate 100, a display layer 200 that may be positioned on the substrate 100 and defines pixel regions, and an encapsulation layer 300 that may be a sealing member for sealing the display layer 200. According to an embodiment, the display panel 10 may further include a lower protection film 175 positioned below the substrate 100.

The substrate 100 may include glass or polymer resin. The polymer resin may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP). For example, the substrate 100 including the polymer resin may be flexible, rollable, or bendable. The substrate 100 may have a multi-layer structure including a layer including the above-described polymer resin and an inorganic layer (not shown). For example, the substrate 100 may have a multi-layer structure including a first polymer resin layer and a second polymer resin layer. An inorganic layer may be between the first polymer resin layer and the second polymer resin layer.

A buffer layer 111 may be positioned on the substrate 100 and may reduce or prevent penetration of dust material, moisture, or external air from a lower portion of the substrate 100. The buffer layer 111 may include an inorganic material such as an oxide or a nitride, an organic material, or an organic/inorganic composite material and may have a single layer or a multi-layer structure.

The display layer 200 may include pixels. Each of the pixels may include a pixel circuit including a thin-film transistor (TFT) for example, a main TFT (TFTm) and an auxiliary TFT (TFTa), a display element electrically connected to the pixel circuit, and an insulating layer IL between the pixel circuit and the display element. The display element may include an organic light-emitting diode (OLED).

The main pixels Pm including the main TFT TFTm and a display element connected thereto may be positioned in the display area DA. The auxiliary pixels Pa including the auxiliary TFT TFTa and a display element connected thereto may be positioned in the sensor area SA. Although not shown, at least one wiring may be positioned in each of the display area DA and/or the sensor area SA.

The sensor area SA may be an area in which the component 20 such as a sensor may be positioned. The component 20 may correspond to the sensor area SA below the substrate 100. The component 20 may be an electronic element that outputs and/or receives light or sound. For example, the component 20 may be a sensor that uses received light, such as an infrared sensor, or a sensor that outputs and detects light or sound so as to measure a distance or recognize fingerprints. In some embodiments, the component 20 may includes an image sensor. For example, the component 20 may be a kind of camera which includes the image sensor and lens(es). The component 20 may capture an image by detecting or receiving light through the transmission part TA. When the component 20 is an electronic element that uses light, the component 20 may use light having a variety of wavelength bands, such as visible light, infrared light, ultraviolet (UV) light, and the like. In some embodiment, the component 20 positioned in the sensor area SA may be provided in plural. For example, a light-emitting device and a light-receiving device that are several components 20 may be provided at positions corresponding to one sensor area SA. As an example, a light-emitting unit and a light-receiving unit may be provided together as one component 20.

The auxiliary pixels Pa of the sensor area SA may overlap the component 20, and the transmission part TA may overlap the component 20. The transmission part TA may be an area in which an auxiliary TFT TFTa and a display element are not positioned. Light or signals emitted from the component 20 and/or light or signals incident onto the component 20 may transmit through the transmission part TA.

The transmission part TA may be positioned between neighboring pixels. For example, in FIG. 2A, the auxiliary pixels Pa and the main pixels Pm may be apart from one another with the transmission part TA therebetween. In some embodiment, pixels apart from one another with the transmission part TA therebetween may be auxiliary pixels. For example, at least two auxiliary pixels Pa may be apart from one another with the transmission part TA therebetween.

Pixels, for example, each of the main pixels Pm and the auxiliary pixels Pa, may be covered with the encapsulation layer 300. The encapsulation layer 300 may include at least one inorganic encapsulation layer and at least one organic encapsulation layer. In this regard, FIG. 2A illustrates first and second inorganic encapsulation layers 310 and 330 and an organic encapsulation layer 320 therebetween.

The first and second inorganic encapsulation layers 310 and 330 may include at least one inorganic insulating material, such as an aluminum oxide, a titanium oxide, a tantalum oxide, a hafnium oxide, a zinc oxide, a silicon oxide, a silicon nitride, or a silicon oxynitride. The organic encapsulation layer 320 may include a polymer-based material. The polymer-based material may include PET, PEN, PC, PI, polyethylenesulphonate, polyoxymethylene, polyarylate, hexamethyldisiloxane (HMDSO), acryl-based resin (for example, polymethylmethacrylate, polyacrylic acid), or an arbitrary combination thereof. The encapsulation layers 310, 320, and 330 may include any other suitable materials.

A light-shielding layer 400 may include a first hole 400OP that corresponds to the transmission part TA. The light-shielding layer 400 defines the first hole 400OP as corresponding to the transmission part TA and includes a part of the light-shielding layer 400 that may include a light-shielding material (for example, metal or black ink or other material). The part of the light-shielding layer 400 may be positioned to cover the main pixels Pm of the display area DA and the auxiliary pixels Pa of the sensor area SA. A part of the light-shielding layer 400 for covering the main pixels Pm of the display area DA and a part for covering the auxiliary pixels Pa of the sensor area SA may be connected as one body (single body). The light-shielding layer 400 that covers the main pixels Pm of the display area DA and the auxiliary pixels Pa of the sensor area SA may be an integral or continuous layer. For example, the light-shielding layer 400 may correspond to the entire area except for the transmission part TA of the sensor area SA of the display panel 10. In other words, the light-shielding layer 400 may surround the transmission part TA.

The light-shielding layer 400 may be between the multi-layer structure of the substrate 100. For example, the light-shielding layer 400 may be between sub-layers that constitute the substrate 100 as described in FIG. 2A.

The first hole 400OP of the light-shielding layer 400 may overlap a polymer resin layer (or an inorganic layer) positioned above or below the light-shielding layer 400.

The term overlap may include layer, stack, face or facing, extending over, covering or partly covering or any other suitable term as would be appreciated and understood by those of ordinary skill in the art.

The light-shielding layer 400 may include, for example, metal or metal oxide, such as chrome or chrome oxide. For example, the light-shielding layer 400 may be formed in a single layer or stack layer formed by sputtering or E-beam deposition. In an embodiment, the light-shielding layer 400 may include an absorbance material. For example, the light-shielding layer 400 may absorb at least external light. The absorbance material may include carbon black or an organic insulating material, for example.

The lower protection film 175 may be attached to a lower portion of the substrate 100 so as to support and protect the substrate 100. The lower protection film 175 may include an opening 175OP that corresponds to the sensor area SA. The opening 175OP may be provided in the lower protection film 175 so that light transmissivity of the sensor area SA may be improved. The lower protection film 175 may include PET or PI or other materials.

The area of the sensor area SA may be larger than an area in which the component 20 may be positioned. In FIG. 2A, the area of the sensor area SA and the area of the opening 175OP may be the same or similar. However, the area of the opening 175OP of the lower protection film 175 may not coincide with the area of the sensor area SA. For example, the area of the opening 175OP may be smaller than the area of the sensor area SA.

Although not shown, an element, such as an input-sensing member for sensing inputs, an anti-reflective member including a polarizer and a retarder or a color filter and a black matrix, and a transparent window, may be positioned on the display panel 10.

In the embodiment, the encapsulation layer 300 may be used as an encapsulation member for sealing the display layer 200. However, embodiments are not limited thereto. For example, a sealing substrate to be combined with the substrate 100 using sealant or frit may also be used as a member for sealing the display layer 200.

Figure 2B:
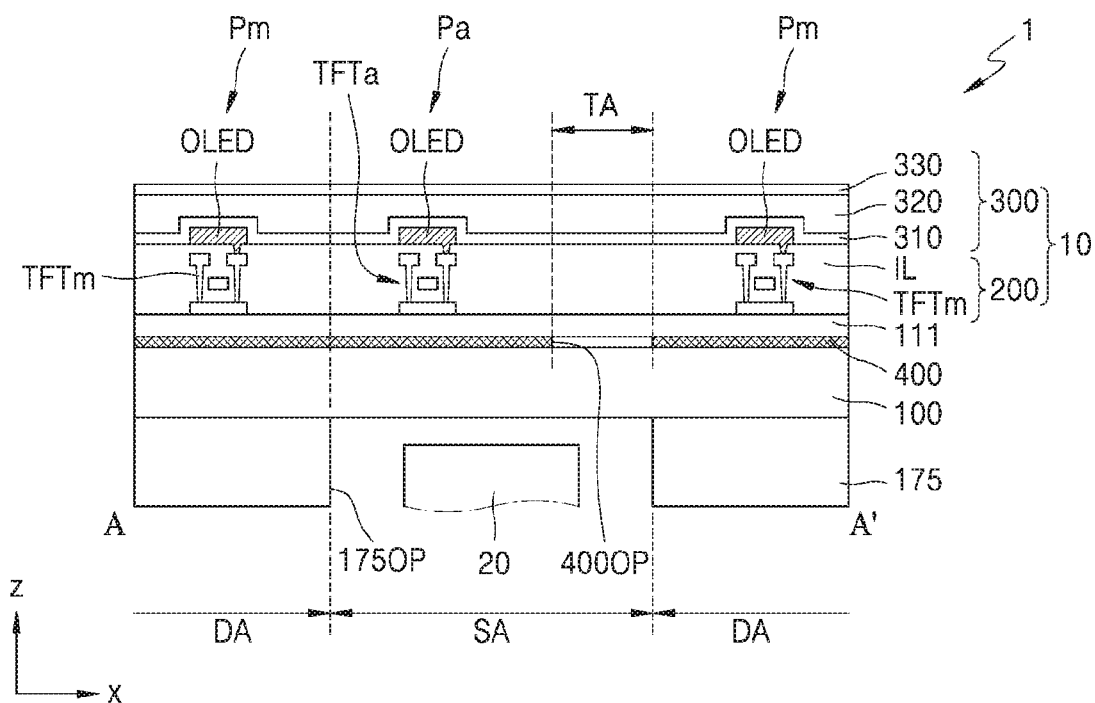
FIG. 2B is a schematic cross-sectional view illustrating a display device according to an embodiment.

FIG. 2B is a schematic cross-sectional view illustrating the display device 1 according to an embodiment. FIG. 2B may correspond to a cross-section taken along a line A-A' of FIG. 1.

The display device 1 of FIG. 2B has a substantially similar structure as that of FIG. 2A but is different from the display device 1 of FIG. 2A in that the light-shielding layer 400 may be between the substrate 100 and the display layer 200. Hereinafter, a difference thereof will be described.

The light-shielding layer 400 may be between the substrate 100 and the display layer 200 on the substrate 100, for example, between the substrate 100 and the buffer layer 111. As another example, the light-shielding layer 400 may also be between the substrate 100 and TFTs, that is, the main and auxiliary TFTs TFTm and TFTa, included in the display layer 200.

The light-shielding layer 400 may include a metal or metal oxide, or an absorbance material including a black pigment or dye, for example. The description of the light-shielding layer 400 given above with reference to FIG. 2A may apply to that of the light-shielding layer 400 having the first hole 400OP.

Figure 2C:
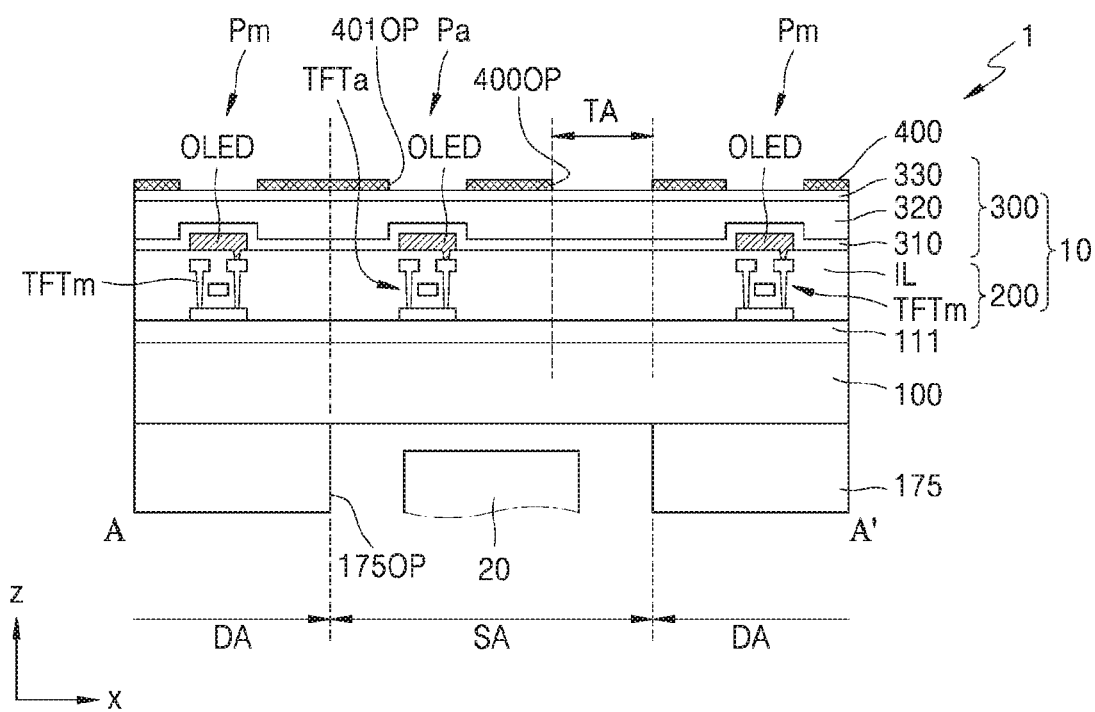
FIG. 2C is a schematic cross-sectional view illustrating a display device according to an embodiment.
Figure 2D:
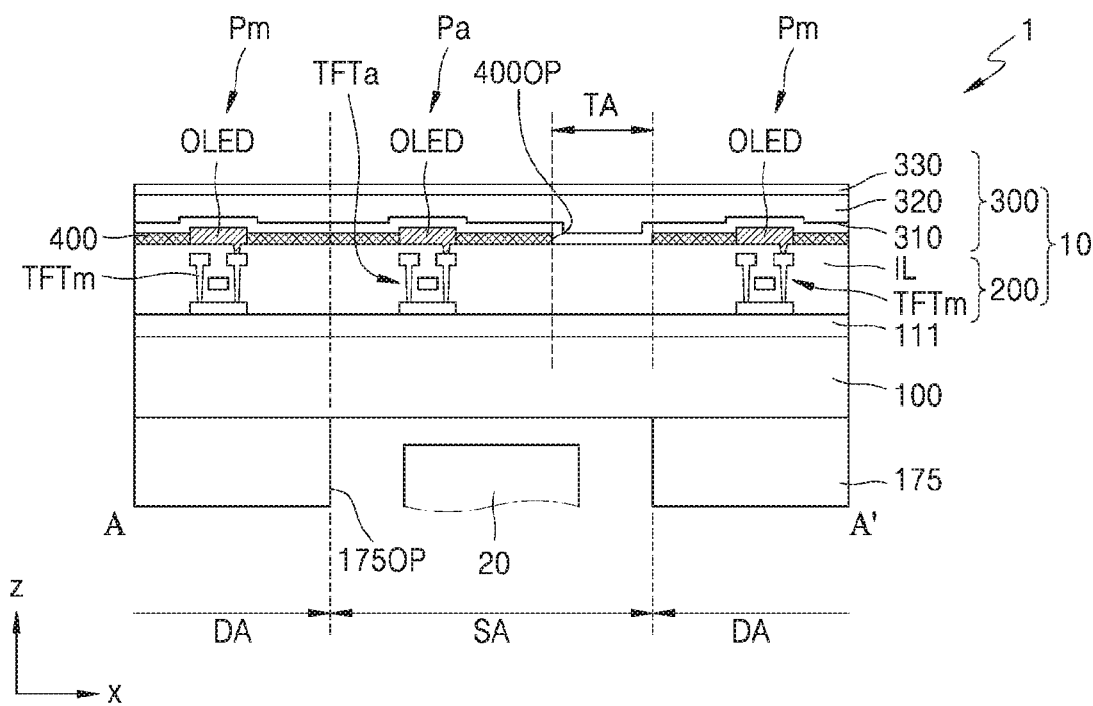
FIG. 2D is a schematic cross-sectional view illustrating a display device according to an embodiment.

FIGS. 2C and 2D are schematic cross-sectional views illustrating display devices 1 according to other embodiments.

The display devices 1 of FIGS. 2C and 2D have a substantially similar structure as that of FIG. 2A but are different from the display device 1 of FIG. 2A in the position of the light-shielding layer 400. Hereinafter, for convenience of explanation, the similar features of the display device 1 given above with reference to FIG. 2A may apply to the display device 1, and a difference thereof will be described.

The light-shielding layer 400 may be positioned on the encapsulation layer 300, as shown in FIG. 2C. The light-shielding layer 400 may include a first hole 400OP that corresponds to the transmission part TA and a second hole 401OP that corresponds to an emission area of each of the display elements (for example, OLEDs) of the display layer 200.

The light-shielding layer 400 may be between the insulating layer IL and the encapsulation layer 300, as shown in FIG. 2D. The light-shielding layer 400 may include the first hole 400OP that corresponds to the transmission part TA and second holes 401OP that correspond to emission areas of display elements, for example, OLEDs of the display layer 200 as in FIG. 2C.

The display elements may be organic light emitting diode (OLED) elements but may include other types of display elements within the spirit and scope of the invention. The display elements may be defined as first and second display elements but the definition is not limited thereto. First and second may be used interchangeably and may include more than first and second. For example, the description may include third and fourth display elements and the like. The display elements may be separated from each other by a separation distance.

The separation distance between display elements may be defined as a distance between emission areas of respective display elements. The descriptions of these elements will be described later on in reference to FIGS. 9-12. However, the separation distance is not limited to the above description and may include other definitions as would be understood and appreciated by those of ordinary skill in the art and within the spirit and scope of the invention.

Figure 3:
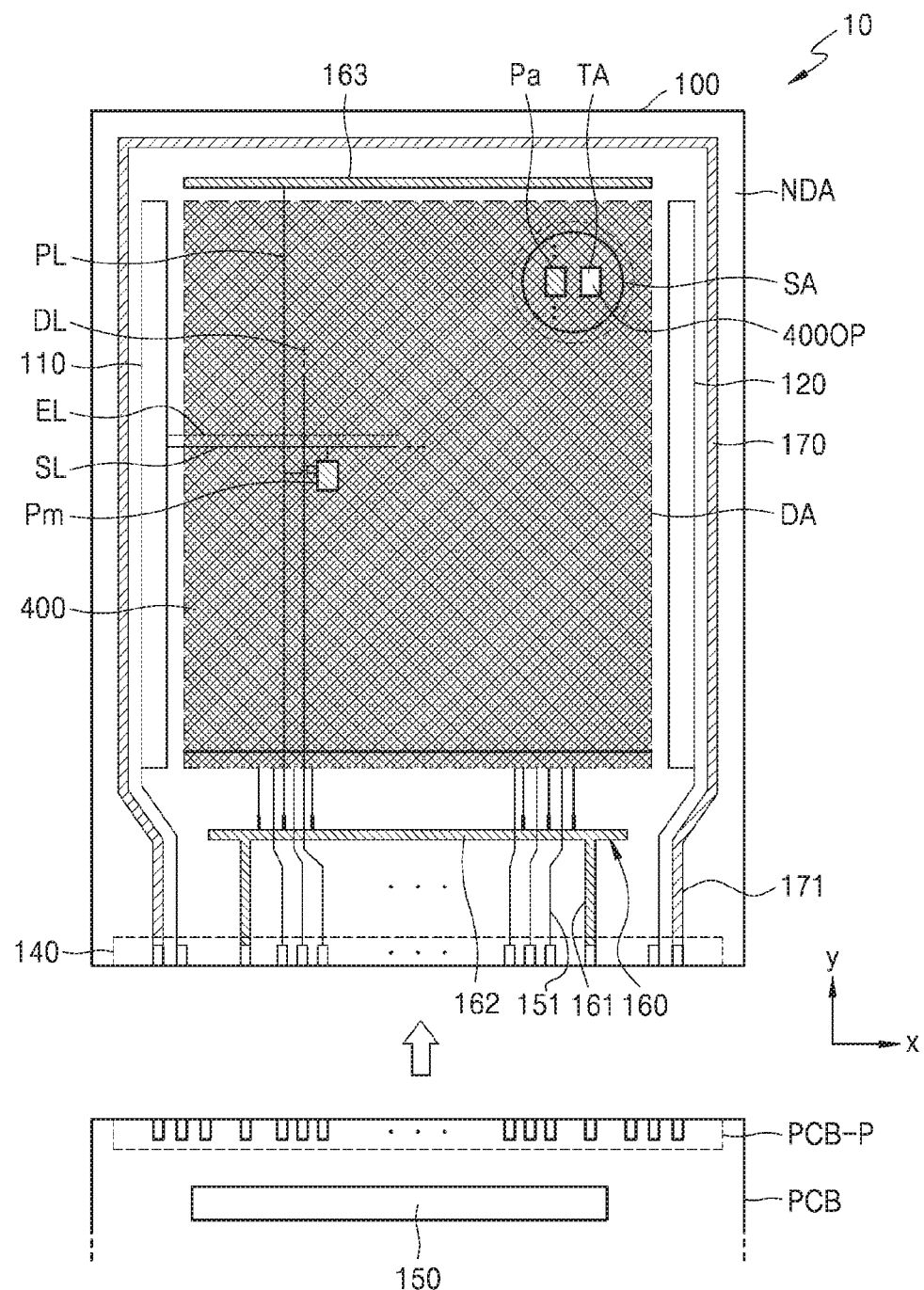
FIG. 3 is a plan view illustrating a display panel according to an embodiment.

FIG. 3 is a plan view illustrating a display panel 10 according to an embodiment.

Referring to FIG. 3, the display panel 10 may include main pixels Pm positioned in the display area DA. Each of the main pixels Pm may include a display element, such as an OLED. Each of the main pixels Pm may emit, for example, red light, green light, blue light, or white light from the OLED.

The sensor area SA may be inside the display area DA, and auxiliary pixels Pa may be positioned in the sensor area SA. Each of the auxiliary pixels Pa may include a display element, such as an OLED. Each of the auxiliary pixels Pa may emit, for example, red light, green light, blue light, or white light from the OLED. A transmission part TA may be provided in the sensor area SA. The transmission part TA may be surrounded by pixels.

Because the sensor area SA may include the transmission part TA, as described above, the resolution of an image from the sensor area SA may be lower than the resolution of an image from the display area DA. For example, the resolution of the sensor area SA may be about ½ of the display area DA. In an embodiment, the resolution of the display area DA may be 400 ppi or more, and the resolution of the sensor area SA may be about 200 ppi.

Each of the main pixels Pm and the auxiliary pixels Pa may be electrically connected to external circuits positioned in the non-display area NDA. A first scan driving circuit 111, a second scan driving circuit 120, a terminal 140, a data driving circuit 150, a first power supply line 160, and a second power supply line 170 may be positioned in the non-display area NDA.

The first scan driving circuit 110 may provide a scan signal to each of the main pixels Pm and the auxiliary pixels Pa via a scan line SL. The first scan driving circuit 110 may provide an emission control signal to each of the main pixels Pm and the auxiliary pixels Pa via an emission control line EL. The second scan driving circuit 120 may be positioned in parallel to the first scan driving circuit 110 with the display area DA therebetween. Some of the main pixels Pm and the auxiliary pixels Pa positioned in the display area DA may be electrically connected to the first scan driving circuit 110, and the other ones may be connected to the second scan driving circuit 120. In an embodiment, the second scan driving circuit 120 may be omitted.

The terminal 140 may be positioned at one edge of the substrate 100. The terminal 140 may not be covered by an insulating layer but may be exposed and thus may be electrically connected to a printed circuit board (PCB). A terminal PCB-P of the PCB may be electrically connected to the terminal 140 of the display panel 10. The PCB may transmit a signal or power of a controller (not shown) to the display panel 10. Control signals of the controller may be transmitted to each of the first and second scan driving circuits 110 and 120 via the PCB. The controller may provide first power and second power to the first and second power supply lines 160 and 170, respectively, via first and second connection wirings 161 and 171. A first power supply voltage may be provided to each of the main pixels Pm and the auxiliary pixels Pa via a driving voltage line PL connected to the first power supply line 160, and a second power supply voltage may be provided to an opposite electrode of each of the main pixels Pm and the auxiliary pixels Pa connected to the second power supply line 170.

A data driving circuit 150 may be electrically connected to a data line DL. A data signal of the data driving circuit 150 may be provided to each of the main pixels Pm and the auxiliary pixels Pa via a connection wiring 151 connected to the terminal 140 and the data line DL connected to the connection wiring 151. FIG. 3 illustrates that the data driving circuit 150 is positioned on the PCB. However, in an embodiment, the data driving circuit 150 may be positioned on the substrate 100. For example, the data driving circuit 150 that is a Chip on Panel (CoP) type may be positioned on the substrate 100.

The first power supply line 160 may include a first sub-line 162 and a second sub-line 163, which extend in parallel to each other in an x-direction with the display area DA therebetween. The second power supply line 170 may partially surround the display area DA in the form of a loop having one side open.

The light-shielding layer 400 may include a first hole 400OP that corresponds to the transmission part TA. A part (for example, a body part) of the light-shielding layer 400 for defining the first hole 400OP may cover pixels around the transmission part TA. In an embodiment, the part of the light-shielding layer 400 may overlap the entirety of the display area DA and a part of the sensor area SA, as shown in FIG. 3.

The light-shielding layer 400 may include a metal or metal oxide, or a light-shielding material including black ink or pigment, for example. In an embodiment, the same voltage as one among voltages applied to display elements may be applied to the light-shielding layer 400 including the metal or metal oxide. For example, the voltage may be applied to the light-shielding layer 400 via any one of an initialization voltage line (for example, an initialization voltage line VL of FIG. 8), the first power supply line 160, and the second power supply line 170. The voltage may be one of an initialization voltage Vint, a first power supply voltage (for example, a driving voltage) ELVDD, and a second power supply voltage (for example, a common voltage) ELVSS.

Figure 4:
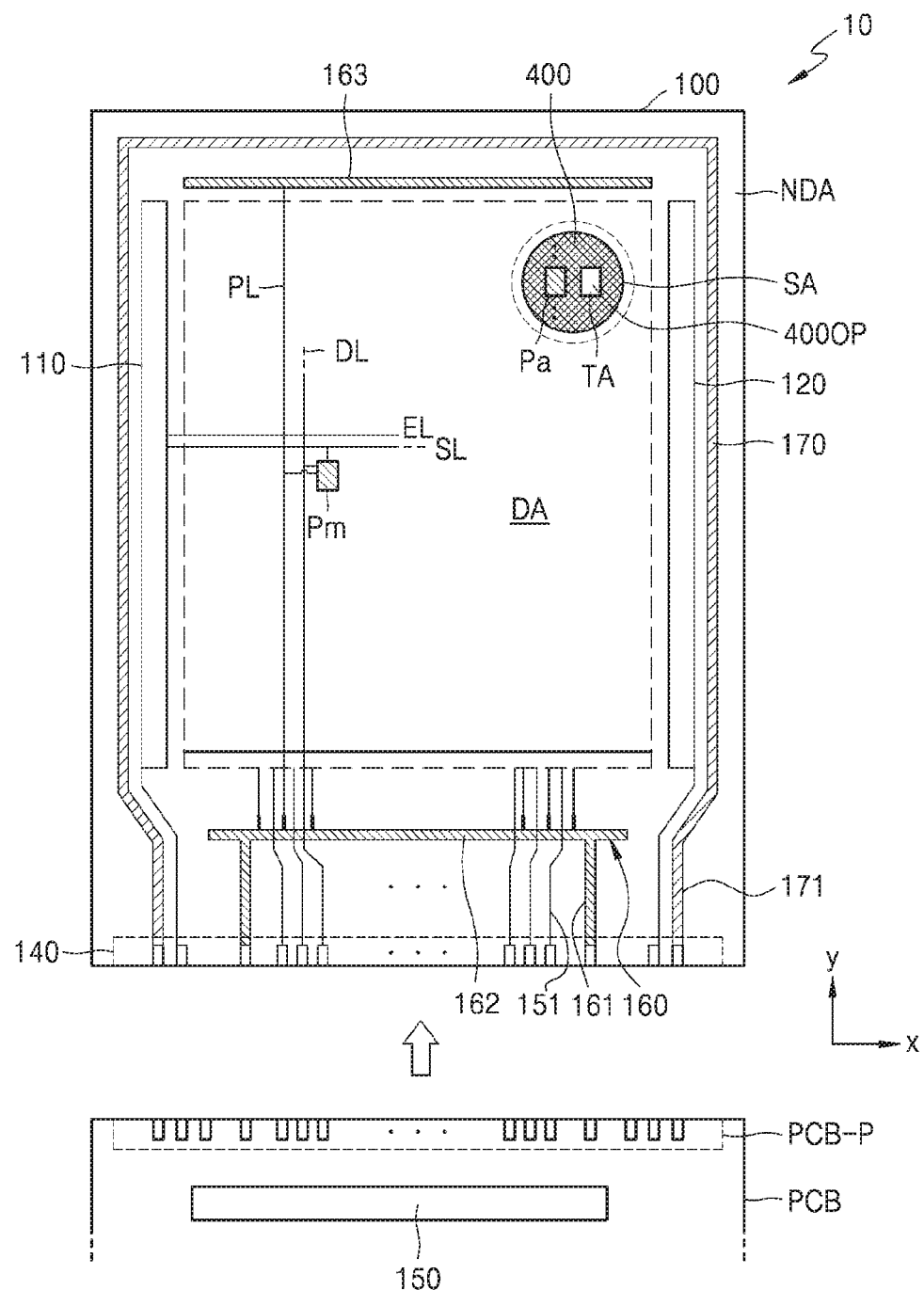
FIG. 4 is a plan view illustrating a display device according to an embodiment.

FIG. 4 is a plan view illustrating a display panel according to an embodiment.

Referring to FIG. 4, a light-shielding layer 400 may correspond to a sensor area SA of a display area DA. For example, the light-shielding layer 400 may be positioned in at least a part of the sensor area SA. The description given above with reference to FIG. 3 may apply to other configurations than the light-shielding layer 400.

As shown in FIG. 4, the light-shielding layer 400 in the sensor area SA may be between neighboring layers among layers that constitute the display panel 10. This will be described in more detail with reference to FIGS. 5A through 5D.

FIGS. 5A through 5D are schematic cross-sectional views illustrating a display device 1 according to embodiments.

As described above with reference to FIG. 4, a light-shielding layer 400 may include a first hole 400OP, which may be positioned in a sensor area SA and corresponds to a transmission part TA.

Figure 5A:
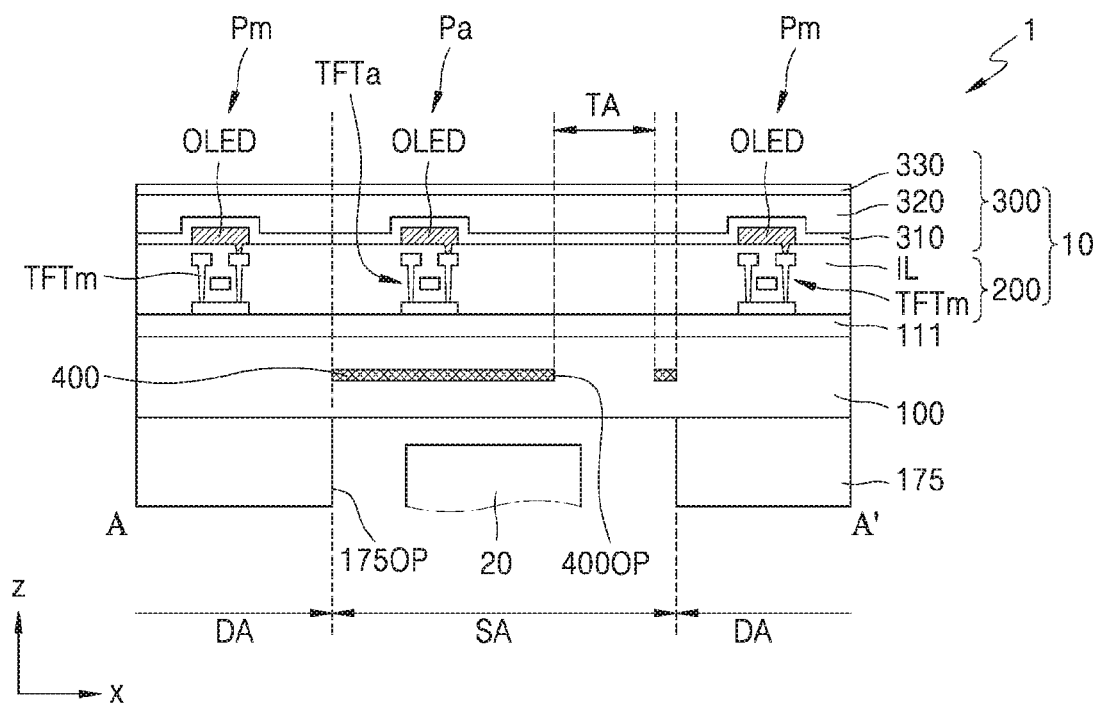
FIGS. 5A through 5D are schematic cross-sectional views illustrating a display device according to embodiments.
Figure 5B:
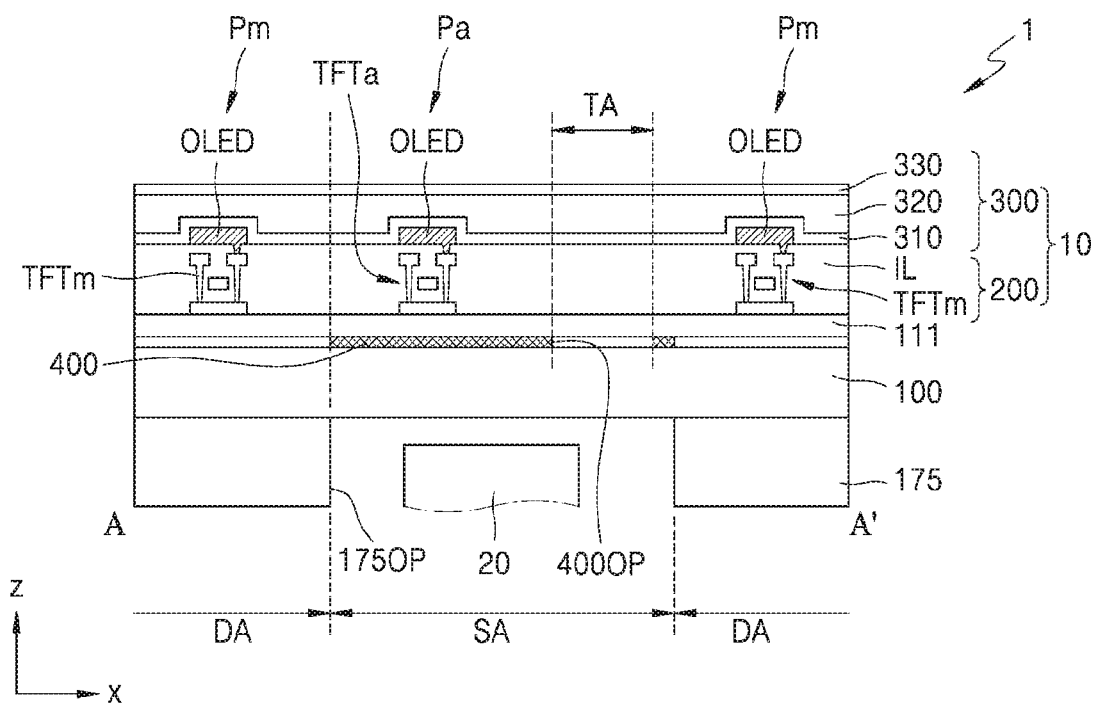

As shown in FIGS. 5A and 5B, the light-shielding layer 400 may be between multiple or plural layers in a substrate 100 or between the substrate 100 and a display layer 200.

Figure 5C:
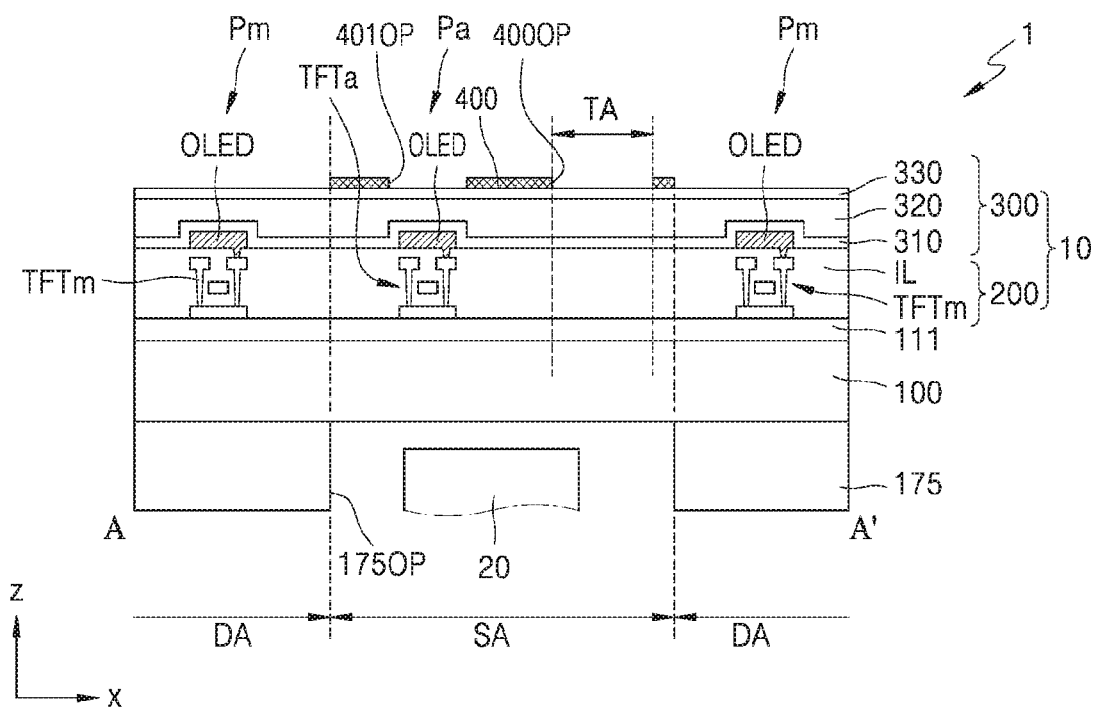
Figure 5D:
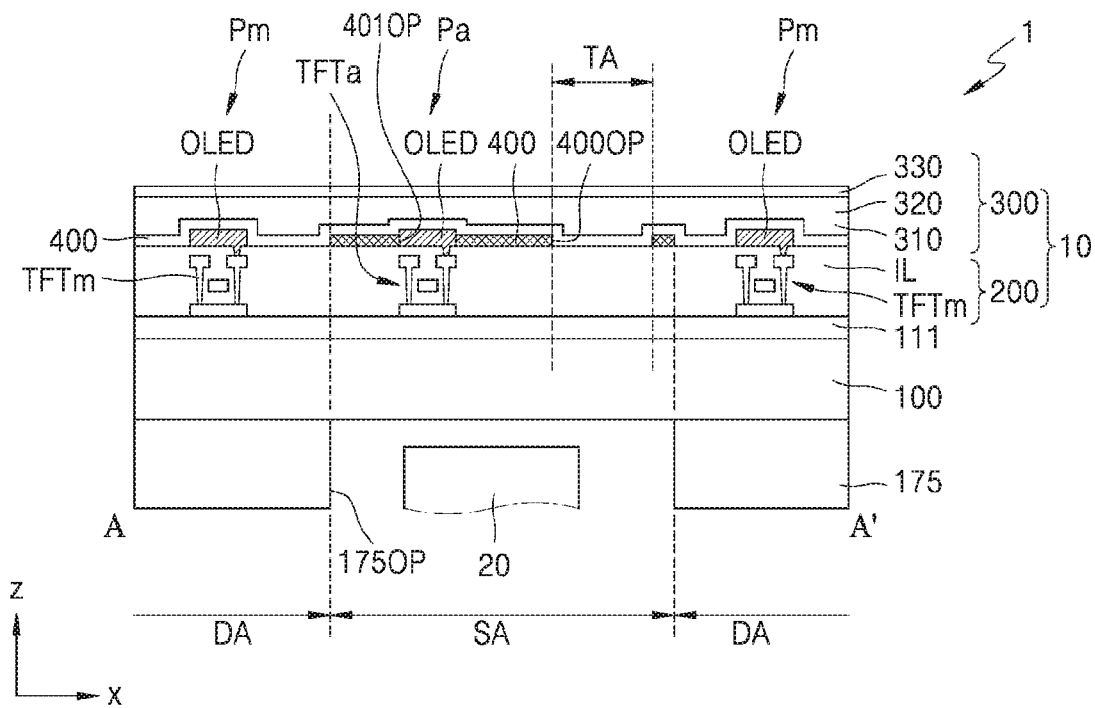

In an embodiment, as shown in FIGS. 5C and 5D, the light-shielding layer 400 may be positioned on an encapsulation layer 300 (see FIG. 5C) or between an insulating layer IL for covering a TFT (for example, an auxiliary TFT TFTa) and the encapsulation layer 300 (see FIG. 5D). For example, for transmission of light emitted from display elements, e.g., OLEDs positioned in the auxiliary pixels Pa, the light-shielding layer 400 may include a second hole 401OP that corresponds to each display element.

The embodiments of FIGS. 2A through 2D may be similar to the embodiments of FIGS. 5A through 5D except that in the embodiments of FIGS. 5A through 5D, the light-shielding layer 400 may not be included in or may not overlap the display area DA but surround the transmission part TA in the sensor area SA.

Figure 6A:
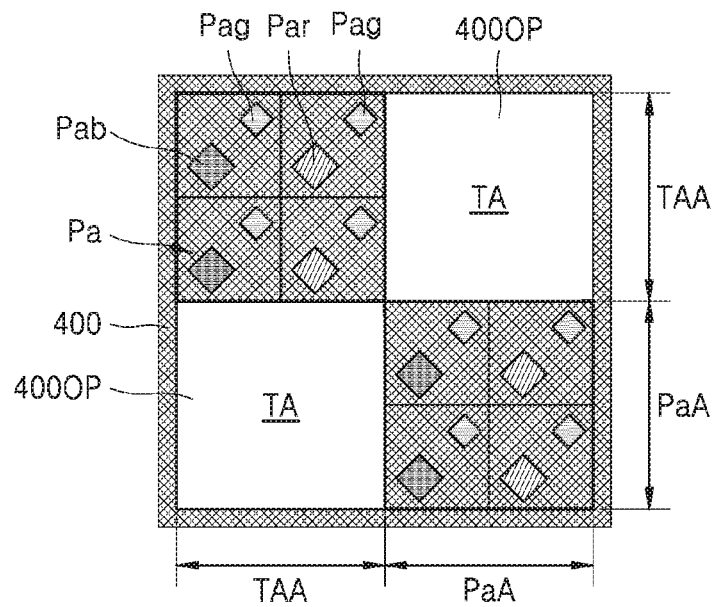
FIGS. 6A and 6B are plan views each illustrating a part of a sensor area of display devices according to other embodiments.
Figure 6B:
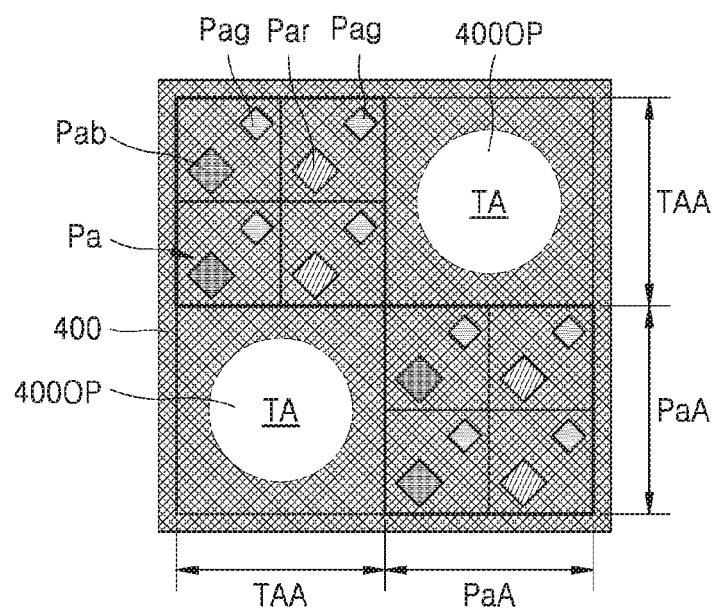

FIGS. 6A and 6B are plan views illustrating a part of a sensor area SA of a display device according to other embodiments.

The sensor area SA may include an auxiliary pixel area PaA including at least one auxiliary pixel Pa and a transmission area TAA including at least one transmission part TA.

For example, the auxiliary pixel area PaA and the transmission area TAA may have the form of a lattice in which they cross each other in x-axis and y-axis directions.

In an embodiment, the auxiliary pixel area PaA may include a red emission area Par in which red light may be emitted, a green emission area Pag in which green light may be emitted, and a blue emission area Pab in which blue light may be emitted. In FIGS. 6A and 6B, emission areas may be of PENTILE® types. However, the emission areas may be of stripe types or other suitable arrangements and types as would be appreciated by those of ordinary skill in the art.

The light-shielding layer 400 may include at least one first hole 400OP that corresponds to the transmission part TA of the sensor area SA, as shown in FIGS. 6A and 6B. The first hole 400OP may be defined by a part (for example, a body part) including a material for forming the light-shielding layer 400, and the periphery of the transmission part TA may be covered with the part including the material for forming the light-shielding layer 400.

For example, the transmission part TA may be defined by the first hole 400OP of the light-shielding layer 400. The transmission part TA may have a rectangular shape (see FIG. 6A) in a direction perpendicular to a top surface of a substrate, a circular shape (see FIG. 6B), or an oval shape or other shapes that would be appreciated by those of ordinary skill in the art. The shapes as illustrated in FIGS. 6A and 6B are illustrated as examples only but the shapes are not limited thereto.

Figure 7:
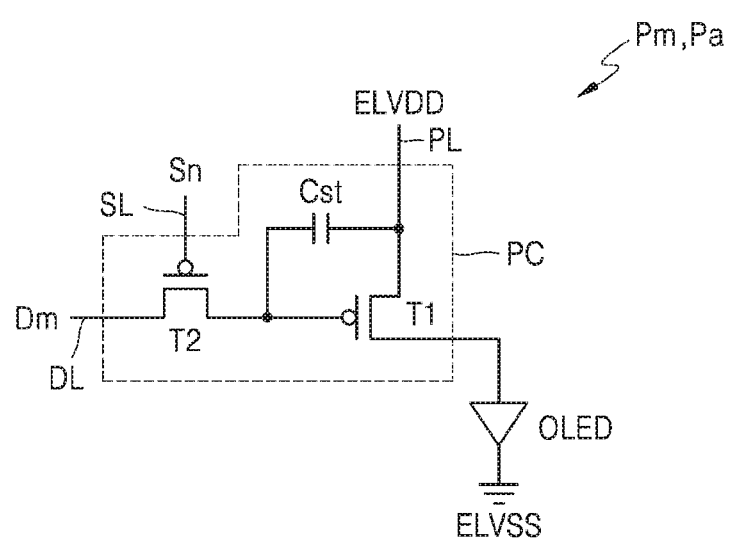
FIG. 7 is an equivalent schematic circuit diagram of pixels according to an embodiment.
Figure 8:
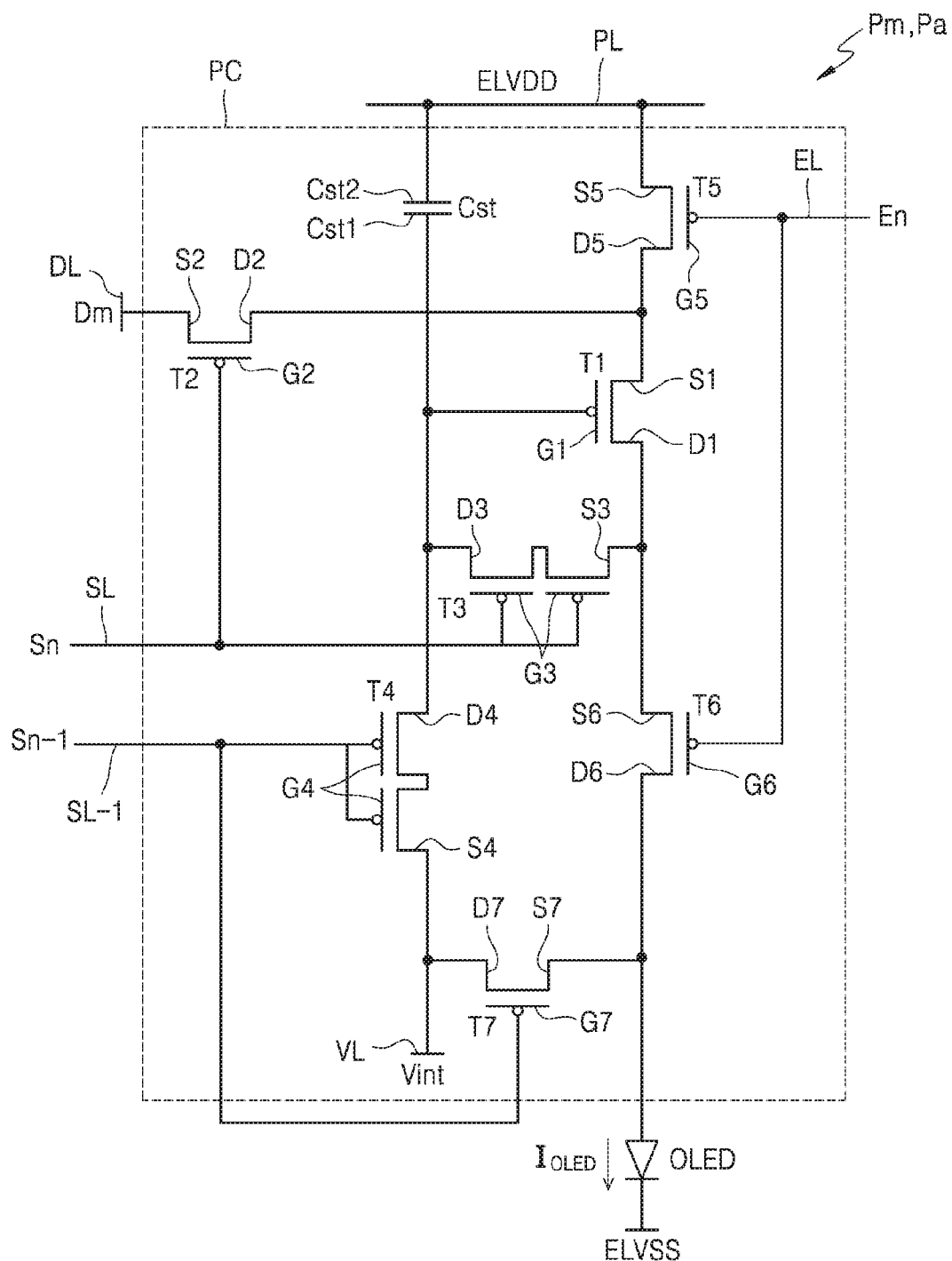
FIG. 8 is an equivalent schematic circuit diagram of pixels according to an embodiment.

FIG. 7 is an equivalent schematic circuit diagram of pixels according to an embodiment, and FIG. 8 is an equivalent schematic circuit diagram of pixels according to an embodiment. For example, the equivalent schematic circuit diagram of FIG. 7 or 8 may be applied to the main pixels Pm and/or the auxiliary pixels Pa of the specification.

Referring to FIG. 7, each of the main pixels Pm and the auxiliary pixels Pa may include a pixel circuit PC connected to a scan line SL and a data line DL and an OLED connected to the pixel circuit PC.

The pixel circuit PC may include a driving TFT T1, a switching TFT T2, and a storage capacitor Cst. The switching TFT T2 may be connected to the scan line SL and the data line DL and may transmit a data signal Dm input through the data line DL to the driving TFT T1 according to the scan signal Sn input through the scan line SL.

The storage capacitor Cst may be connected to the switching TFT T2 and the driving voltage line PL and may store a voltage that corresponds to a difference between a voltage transmitted from the switching TFT T2 and the first power supply voltage ELVDD (or a driving voltage) supplied to the driving voltage line PL.

The driving TFT T1 may be connected to the driving voltage line PL and the storage capacitor Cst and may control a driving current that flows through the OLED from the driving voltage line PL in response to a value of the voltage stored in the storage capacitor Cst. The OLED may emit light having a brightness due to the driving current.

In FIG. 7, the pixel circuit PC may include two TFTs and one storage capacitor. However, embodiments are not limited thereto. As shown in FIG. 8, the pixel circuit PC may include seven TFTs and one storage capacitor.

Referring to FIG. 8, each of the main pixels Pm and the auxiliary pixels Pa may include a pixel circuit PC and an OLED connected to the pixel circuit PC. The pixel circuit PC may include TFTs and storage capacitors. The TFTs and the storage capacitors may be connected to signal lines SL, SL-1, EL, and DL, the initialization voltage line VL, and the driving voltage line PL.

In FIG. 8, each of the main pixels Pm and the auxiliary pixels Pa may be connected to the signal lines SL, SL-1, EL, and DL, the initialization voltage line VL, and the driving voltage line PL. However, embodiments are not limited thereto. In an embodiment, at least one of the signal lines SL, SL-1, EL, and DL, the initialization voltage line VL, and the driving voltage line PL may be shared with neighboring pixels.

The TFTs may include a driving TFT T1, a switching TFT T2, a compensation TFT T3, a first initialization TFT T4, an operation control TFT T5, an emission control TFT T6, and a second initialization TFT T7.

Signal lines may include the scan line SL for transmitting the scan signal Sn, a previous scan line SL-1 for transmitting a previous scan signal Sn-1 to the first initialization TFT T4 and the second initialization TFT T7, an emission control line EL for transmitting an emission control signal En to the operation control TFT T5 and the emission control TFT T6, and a data line DL for transmitting a data signal Dm while crossing the scan line SL. The driving voltage line PL may transmit the first power supply voltage ELVDD (for example, a driving voltage) to the driving TFT T1, and the initialization voltage line VL may transmit the initialization voltage Vint for initializing a pixel electrode and the driving TFT T1.

A driving gate electrode G1 of the driving TFT T1 may be connected to a first storage power storing plate Cst1 of the storage capacitor Cst, and a driving source electrode S1 of the driving TFT T1 may be connected to a lower driving voltage line PL via the operation control TFT T5, and a driving drain electrode D1 of the driving TFT T1 may be electrically connected to a pixel electrode of a main OLED via the emission control TFT T6. The driving TFT T1 may supply a driving current $I_{OLED}$ to the main OLED by receiving the data signal Dm according to a switching operation of the switching TFT T2.

A switching gate electrode G2 of the switching TFT T2 may be connected to the scan line SL, and a switching source electrode S2 of the switching TFT T2 may be connected to the data line DL, and a switching drain electrode D2 of the switching TFT T2 may be connected to the driving source electrode S1 of the driving TFT T1 and may be connected to the lower driving voltage line PL via the operation control TFT T5. The switching TFT T2 may be turned on according to the scan signal Sn received via the scan line SL and may perform a switching operation of transmitting the data signal Dm transmitted to the data line DL to the driving source electrode S1 of the driving TFT T1.

A compensation gate electrode G3 of the compensation TFT T3 may be connected to the scan line SL, and a compensation source electrode S3 of the compensation TFT T3 may be connected to the driving drain electrode D1 of the driving TFT T1 and connected to the pixel electrode of the OLED via the emission control TFT T6, and a compensation drain electrode D3 of the compensation TFT T3 may be connected to the first storage power storing plate Cst1 of the storage capacitor Cst, the first initialization drain electrode D4 of the first initialization TFT T4, and the driving gate electrode G1 of the driving TFT T1. The compensation TFT T3 may be turned on according to the scan signal received via the scan line SL and may be electrically connected to the driving gate electrode G1 and the driving drain electrode D1 of the driving TFT T1, thereby diode-connecting the driving TFT T1.

A first initialization gate electrode G4 of the first initialization TFT T4 may be connected to the previous scan line SL-1, and a first initialization source electrode S4 of the first initialization TFT T4 may be connected to a second initialization drain electrode D7 of the second initialization TFT T7 and the initialization voltage line VL, and a first initialization drain electrode D4 of the first initialization TFT T4 may be connected to the first storage power storing plate Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn-1 received via the previous scan line SL-1 and may perform an initialization operation of transmitting the initialization voltage Vint to the driving gate electrode G1 of the driving TFT T1 to initialize the driving gate electrode G1 of the driving TFT T1.

An operation control gate electrode G5 of the operation control TFT T5 may be connected to the emission control line EL, and an operation control source electrode S5 of the operation control TFT T5 may be connected to the lower driving voltage line PL, and an operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, and an emission control source electrode S6 of the emission control TFT T6 may be connected to the driving drain electrode D1 of the driving TFT T1 and the compensation source electrode S3 of the compensation TFT T3, and an emission control drain electrode D6 of the emission control TFT T6 may be electrically connected to the second initialization source electrode S7 of the second initialization TFT T7 and the pixel electrode of the OLED.

The operation control TFT T5 and the emission control TFT T6 may be simultaneously turned on according to the emission control signal En transmitted via the emission control line EL and may transmit the first power supply voltage ELVDD (for example, a driving voltage) to the main OLED so that the driving current $I_{OLED}$ may flow through the main OLED.

A second initialization gate electrode G7 of the second initialization TFT T7 may be connected to the previous scan line SL-1, and a second initialization source electrode S7 of the second initialization TFT T7 may be connected to the emission control drain electrode D6 of the emission control TFT T6 and the pixel electrode of the main OLED, and a second initialization drain electrode D7 of the second initialization TFT T7 may be connected to a first initialization source electrode S4 of the first initialization TFT T4 and the initialization voltage line VL. The second initialization TFT T7 may be turned on according to the previous scan signal Sn-1 transmitted via the previous scan line SL-1 and may initialize the pixel electrode of the main OLED.

In FIG. 8, the first initialization TFT T4 and the second initialization TFT T7 may be connected to the previous scan line SL-1. However, embodiments are not limited thereto. In an embodiment, the first initialization TFT T4 may be connected to the previous scan line SL-1 and driven according to the previous scan signal Sn-1. The second initialization TFT T7 may be connected to another signal line (for example, a subsequent scan line) and driven according to a signal transmitted to the signal line.

A second storage power storing plate Cst2 of the storage capacitor Cst may be connected to the driving voltage line PL, and an opposite electrode of the OLED may be connected to the second power supply voltage ELVSS (for example, a common voltage). Thus, the OLED may receive the driving current $I_{OLED}$ from the driving TFT T1 and may emit light, thereby displaying an image.

In FIG. 8, each of the compensation TFT T3 and the first initialization TFT T4 has a dual gate electrode. However, each of the compensation TFT T3 and the first initialization TFT T4 has one gate electrode.

In the embodiment, a pixel circuit PC of the main pixel Pm may be the same as that of the auxiliary pixel Pa. However, embodiments are not limited thereto. A pixel circuit PC of the main pixel Pm may be different from that of the auxiliary pixel Pa. For example, there may be various modifications in which the main pixels Pm may employ the pixel circuit of FIG. 8 and the auxiliary pixels Pa may employ the pixel circuit of FIG. 7.

Figure 9:
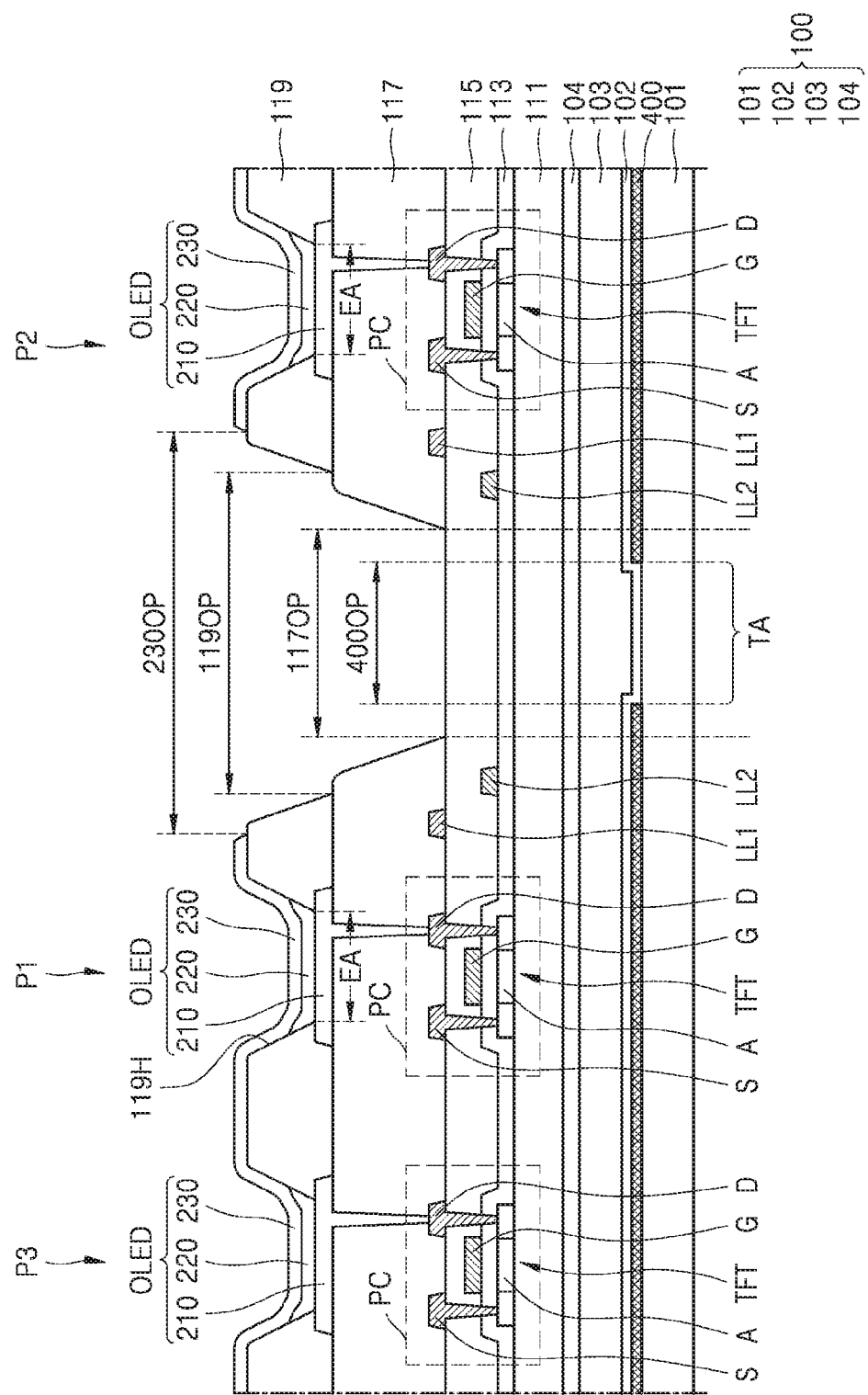
FIG. 9 is a schematic cross-sectional view of a display device according to an embodiment.

FIG. 9 is a schematic cross-sectional view of a display device according to an embodiment.

Referring to FIG. 9, pixels may be positioned around the transmission part TA. In FIG. 9, a first pixel P1, a second pixel P2, and a third pixel P3, which are positioned around the transmission part TA, are shown, and the transmission part TA may be positioned between adjacent (neighboring) first pixel P1 and second pixel P2. The arrangement of pixels is not limited thereto. For example, the transmission part TA may be positioned between the neighboring third pixel P3 and second pixel P2 or the transmission part TA may be positioned between the neighboring first pixel P1 and third pixel P3.

Each of the first pixel P1, the second pixel P2, and the third pixel P3 shown in FIG. 9 may be auxiliary pixels or main pixels described with reference to FIGS. 1 through 6B.

For example, the first pixel P1 and the second pixel P2 may be auxiliary pixels, and the third pixel P3 may be main pixels. As an example, all of the first pixel P1, the second pixel P2, and the third pixel P3 may be auxiliary pixels. For example, the first pixel P1 may be auxiliary pixels, and the second pixel P2 and the third pixel P3 may be main pixels. As an example, the first pixel P1 and the third pixel P3 may be auxiliary pixels, and the second pixel P2 may be main pixels. In another example, the second pixel P2 and the third pixel P3 may be auxiliary pixels, and the first pixel P1 may be main pixels. As an example, the second pixel P2 may be auxiliary pixels, and each of the first pixel P1 and the third pixel P3 may be auxiliary pixels.

The substrate 100 may include a first polymer resin layer 101 and a second polymer resin layer 103. A first barrier layer 102 may be between the first polymer resin layer 101 and the second polymer resin layer 103, and a second barrier layer 104 may be on the second polymer resin layer 103. The first and second barrier layers 102 and 104 may include an inorganic insulating material.

The light-shielding layer 400 may be between sub-layers included in the substrate 100, for example, between the first polymer resin layer 101 and the second polymer resin layer 103. The light-shielding layer 400 may include a first hole 400OP that corresponds to the transmission part TA. The light-shielding layer 400 may include a metal or metal oxide, or a light-shielding material including a black pigment or dye, for example.

The semiconductor layer A may be positioned on the buffer layer 111. The semiconductor layer A may include amorphous silicon. In an embodiment, the semiconductor layer A may include an oxide semiconductor such as indium (In), gallium (Ga), stanium (Sn), zirconium (Zr), vanadium (V), hafnium (Hf), cadmium (Cd), germanium (Ge), chromium (Cr), titanium (Ti) and/or zinc (Zn). For example, the semiconductor layer A may include an oxide semiconductor, such as an indium gallium zinc oxide (IGZO), a zinc tin oxide (ZTO), or a zinc indium oxide (ZIO).

The gate electrode G may be positioned on the semiconductor layer A with the gate insulating layer 113 therebetween. The gate electrode G may include molybdenum (Mo), aluminum (Al), copper (Cu), and titanium (Ti) and may have a single layer or multi-layer structure. In an example, the gate electrode G may have a single layer structure of molybdenum (Mo).

The gate insulating layer 113 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

The source electrode S and/or the drain electrode D may be positioned on the gate electrode G with an interlayer insulating layer 115 therebetween. The source electrode S and/or the drain electrode D may include molybdenum (Mo), aluminum (Al), copper (Cu), and titanium (Ti) and may have a single layer or multi-layer structure. In an example, the source electrode S and/or the drain electrode D may have a multi-layer structure of Ti/Al/Ti. The materials for the various electrodes and insulating layers are not listed in any particular order, and any order or combination may be applied as materials as would be appreciated by those of ordinary skill in the art.

A planarization layer 117 may cover a top surface of the source electrode S and/or the drain electrode D and may have a flat top surface so that the pixel electrode 210 may be flatly formed. The planarization layer 117 may have a single layer or multi-layer structure including an organic material. The planarization layer 117 may include general-purpose polymer, such as benzocyclobutene (BCB), polyimide, HMDSO, PMMA, or PS, a polymer derivative having a phenol-based group, acryl-based polymer, imide-based polymer, arylether-based polymer, amide-based polymer, fluorine-based polymer, p-xylene-based polymer, vinyl alcohol-based polymer, and a blend thereof. The planarization layer 117 may include an inorganic material. The planarization layer 117 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$). When the planarization layer 117 includes an inorganic material, chemical planarization polishing may be performed as may be appropriate. The planarization layer 117 may include all of an organic material and an inorganic material.

A pixel electrode 210 may be a reflective electrode. In an embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a transparent or semi-transparent electrode layer formed on the reflective layer. The transparent or semi-transparent electrode layer may include at least one selected from the group consisting of an indium tin oxide (ITO), an indium zinc oxide (IZO), a zinc oxide (ZnO), an Indium oxide ($In_2O_3$), an indium gallium oxide (IGO), and an aluminum zinc oxide (AZO). In an embodiment, the pixel electrode 210 may have a stack structure of ITO/Ag/ITO.

A pixel-defining layer 119 may be positioned on the planarization layer 117. The pixel-defining layer 119 may have an opening 119H overlapping the pixel electrode 210. The center part of the pixel electrode 210 may be exposed through the opening 119H, thereby defining an emission area EA of each of the first, second, and third pixels P1, P2, and P3. Also, the pixel-defining layer 119 may increase a distance between an end of the pixel electrode 210 and the opposite electrode 230 on the pixel electrode 210, thereby preventing an arc from occurring in the end of the pixel electrode 210. The pixel-defining layer 119 may include an organic insulating material, such as polyamide, acryl resin, BCB, HMDSO, and phenol resin, by spin coating, for example.

An intermediate layer 220 may include an emission layer, for example, an organic emission layer. The organic emission layer may include an organic material including a fluorescent or phosphorescent material that may emit red light, green light, blue light, or white light. The organic emission layer may include a small molecular weight organic material or polymer organic material. A functional layer, such as a hole transport layer (HTL), a hole injection layer (HIL), an electron transport layer (ETL), and an electron injection layer (EIL), may be optionally positioned under and on the organic emission layer.

The opposite electrode 230 may be a light-transmitting electrode. In an embodiment, the opposite electrode 230 may be a transparent or semi-transparent electrode and may include a metallic thin layer having a small work function including lithium (Li), calcium (Ca), LiF/Ca, LiF/Al, aluminum (Al), silver (Ag), magnesium (Mg), and a compound thereof. Also, a transparent conductive oxide (TCO) layer, such as an ITO, an IZO, a ZnO, or an $In_2O_3$, may be positioned on the metallic thin layer. The opposite electrode 230 may be positioned on the intermediate layer 220 and the pixel-defining layer 119. The opposite electrode 230 may be formed as one body (single body) in OLEDs and may correspond to pixel electrodes 210.

When the pixel electrode 210 is a reflective electrode and the opposite electrode 230 is a light-transmitting electrode, light may be emitted from the intermediate layer 220 toward the opposite electrode 230.

Referring to FIG. 9, the planarization layer 117, the pixel-defining layer 119, and the opposite electrode 230 may include a first opening 117OP, a second opening 119OP, and a third opening 230OP, respectively, that may correspond to the transmission part TA. The width of the first opening 117OP may be less than that of the second opening 119OP, and the width of the second opening 119OP may be less than that of the third opening 230OP. The light-shielding layer 400 may include a first hole 400OP that corresponds to the transmission part TA, and the width of the first hole 400OP may be less than that of the first opening 117OP.

As the width of the first hole 400OP is less than a separation distance between display elements or less than that of each of the first opening 117OP, the second opening 119OP, and the third opening 230OP, light, which is diffracted through a fine gap between lines LL1 and LL2 (for example, a data line, a scan line, a driving voltage line, an initialization voltage line, and the like) around each transmission part TA and/or a fine gap formed by transistors and storage capacitors of a circuit provided in each pixel around the transmission part TA, may be cut off.

Although not shown in FIG. 9, in an embodiment, a part of an inorganic insulating layer, i.e., parts of the buffer layer 111, the gate insulating layer 113, and the interlayer insulating layer 115 may be removed to correspond to the transmission part TA. A part of layers corresponding to the transmission part TA may be removed so that transmissivity in the transmission part TA may be improved.

Figure 10A:
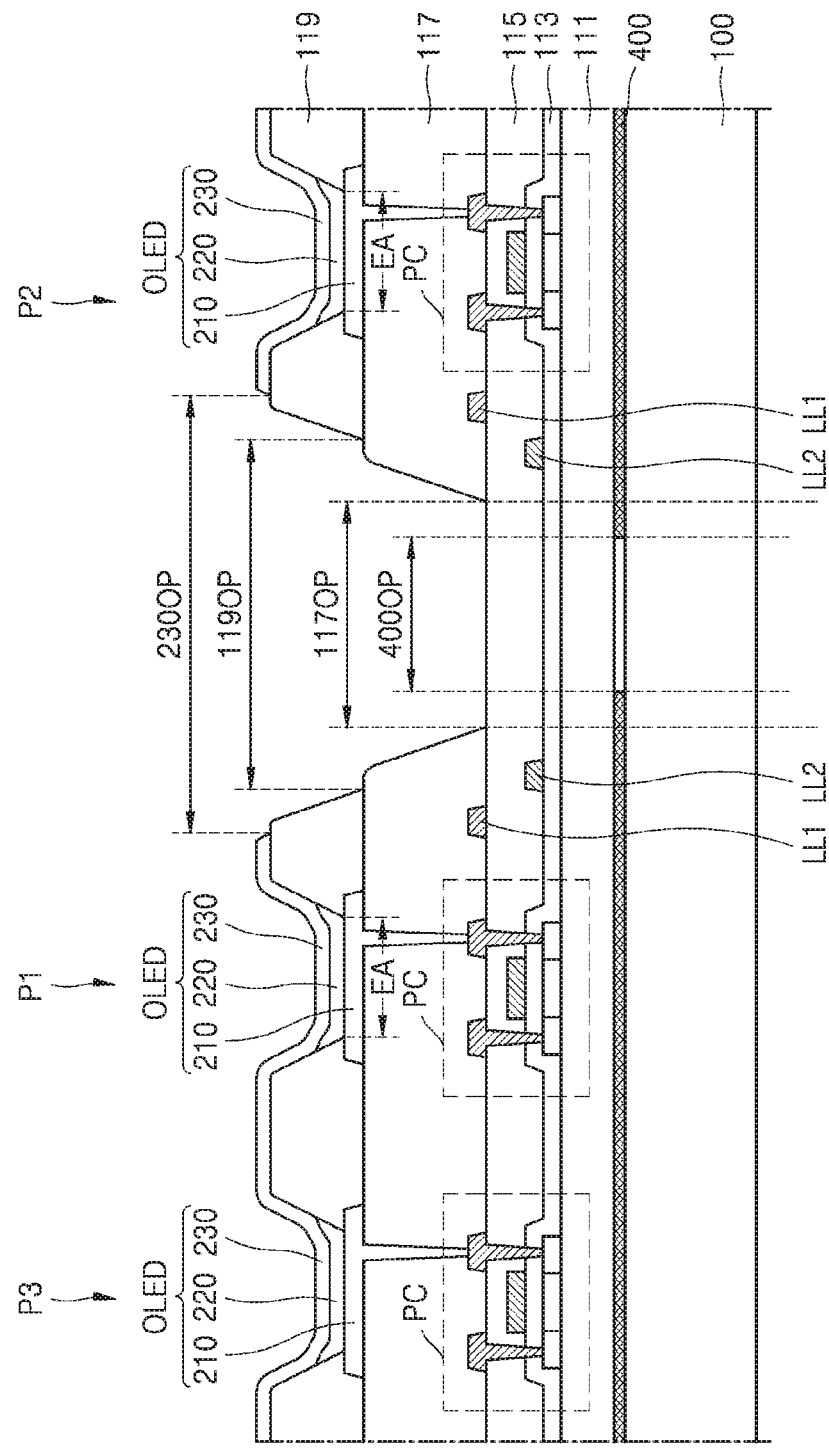
FIGS. 10A and 10B are schematic cross-sectional views of a display device according to embodiments.
Figure 10B:
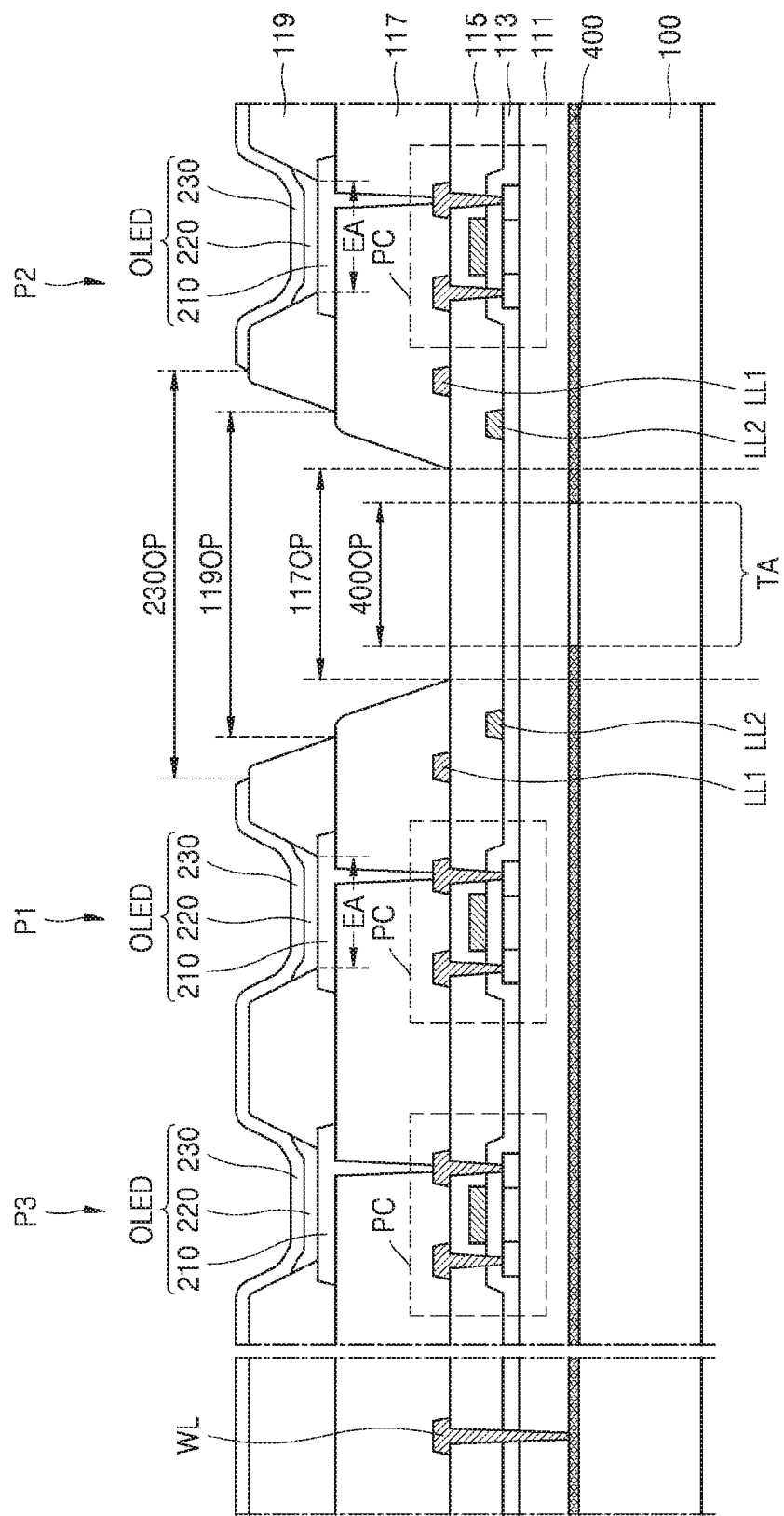

FIG. 10A is a schematic cross-sectional view of a display device according to an embodiment, and FIG. 10B is a schematic cross-sectional view of a display device according to an embodiment. The display device of FIGS. 10A and 10B may prevent diffraction of light through a fine gap between lines LL1 and LL2 (for example, a data line, a scan line, a driving voltage line, an initialization voltage line, and the like) around each transmission part TA and/or a fine gap formed by transistors and storage capacitors of a circuit provided in each pixel around the transmission part TA, as described above with reference to FIG. 9. The display device of FIGS. 10A and 10B is different from the embodiment described with reference to FIG. 9 in the position of the light-shielding layer 400. Thus, a difference thereof will be described.

Referring to FIGS. 10A and 10B, a light-shielding layer 400 may be between a substrate 100 and a pixel circuit PC. For example, the light-shielding layer 400 may be between the substrate 100 and a buffer layer 111. The light-shielding layer 400 may be on a given layer between the substrate 100 and the pixel circuit PC. The light-shielding layer 400 may include an absorbance material including a black pigment or dye.

In an embodiment, the light-shielding layer 400 may include a metal or metal oxide. As illustrated in FIG. 10B, the light-shielding layer 400 may be connected to one wiring WL among wirings electrically connected to a terminal of a PCB of the display device and thus, a voltage may be applied to the light-shielding layer 400. For example, the same voltage as a given voltage applied to display elements may be applied to the light-shielding layer 400.

The wiring WL electrically connected to the light-shielding layer 400 may include one among an initialization voltage line VL, a first power supply line 160, and a second power supply line 170. The voltage applied to the light-shielding layer 400 may be one among an initialization voltage Vint, a first power supply voltage ELVDD (for example, a driving voltage), and a second power supply voltage ELVSS (for example, a common voltage).

Figure 11:
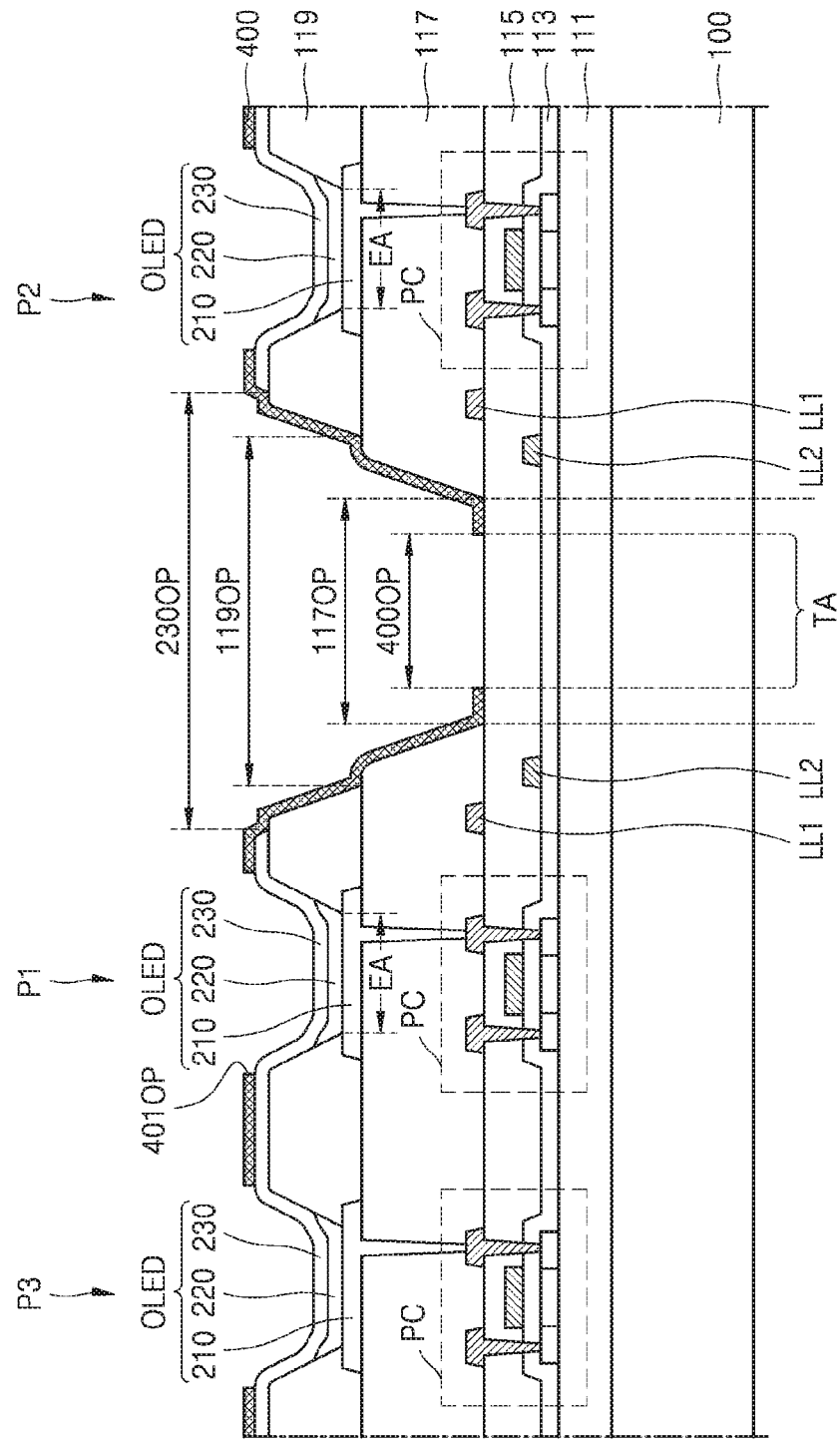
FIG. 11 is a schematic cross-sectional view of a display device according to an embodiment.

FIG. 11 is a schematic cross-sectional view of a display device according to another embodiment.

Referring to FIG. 11, a light-shielding layer 400 may be positioned on an opposite electrode 230 of each of first, second, and third pixels P1, P2, and P3. In an embodiment, the light-shielding layer 400 may be positioned on an encapsulation layer 300 for covering the opposite electrode 230.

The light-shielding layer 400 may include a metal or metal oxide, or an absorbance material including a black pigment or dye. Although not shown, an anti-reflective layer including a polarizer and/or a retarder may be positioned on the light-shielding layer 400.

The light-shielding layer 400 may include a first hole 400OP that corresponds to the transmission part TA and second holes 401OP that correspond to emission areas of each of OLEDs of the first, second, and third pixels P1, P2, and P3.

The width of the first hole 400OP of the light-shielding layer 400 may be less than the width of the first opening 117OP of the planarization layer 117 and the width of the third opening 230OP of the opposite electrode 230, respectively. For example, the width of the third opening 230OP may be greater than the width of the first opening 117OP, and the width of the first opening 117OP may be greater than the width of the first hole 400OP. The pixel defining layer 119 may have an opening 119OP. The width of the third opening 230OP may be greater than the width of the opening 119OP of the pixel defining layer 119, the width of the opening 119OP of the pixel defining layer 119 may be greater than the width of the first opening 117OP and the width of the first opening 117OP may be greater than the width of the first hole 400OP.

Figure 12:
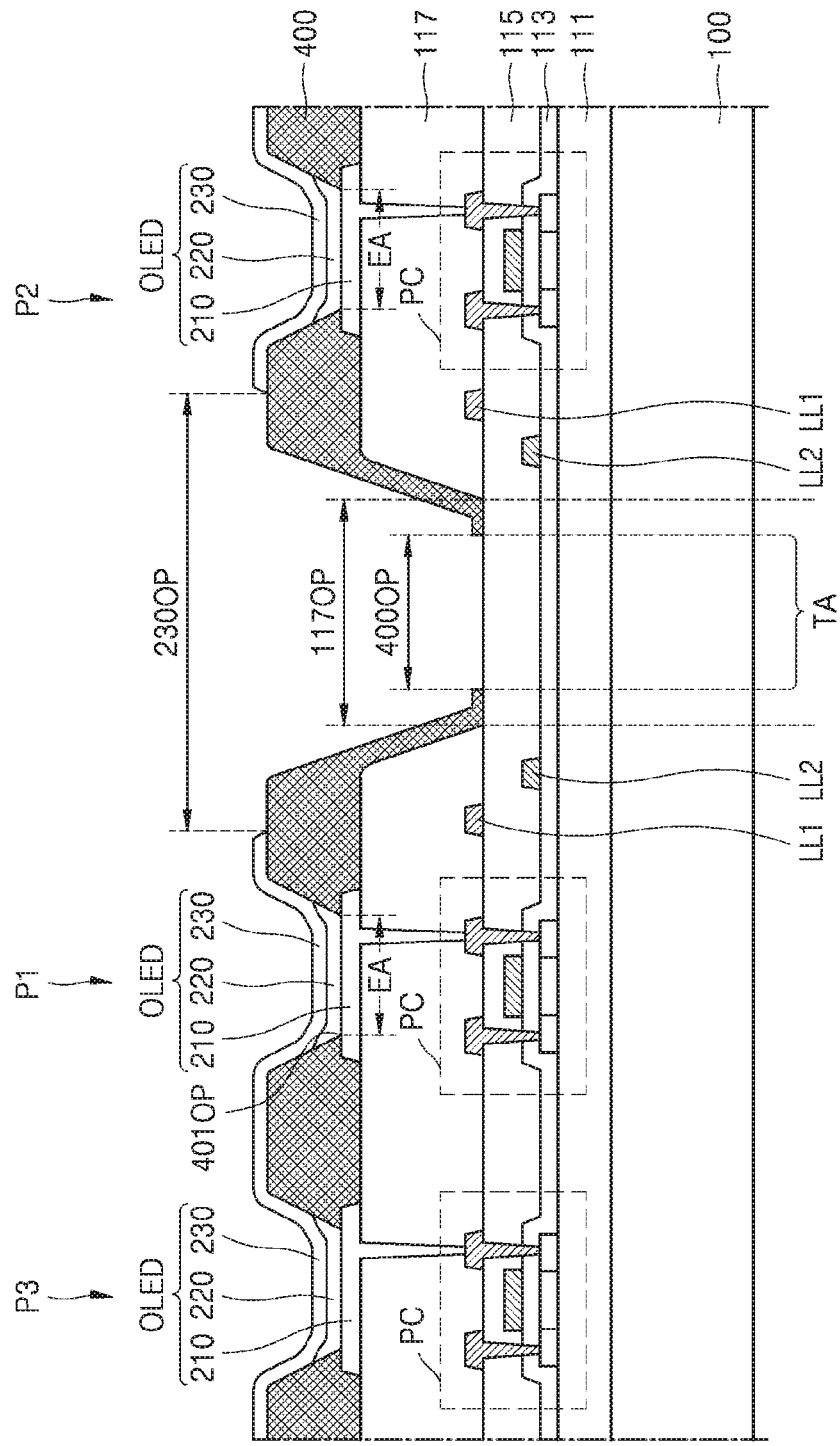
FIG. 12 is a schematic cross-sectional view of a display device according to an embodiment.

FIG. 12 is a schematic cross-sectional view of a display device according to an embodiment.

Referring to FIG. 12, a light-shielding layer 400 may be between a pixel electrode 210 and an intermediate layer 220 of each of first, second, and third pixels P1, P2, and P3. The light-shielding layer 400 may be adjacent side surfaces of the pixel electrode 210 and an intermediate layer 220 of each of first, second, and third pixels P1, P2, and P3. Second holes 401OP that correspond to each emission area EA of the light-shielding layer 400 may overlap each pixel electrode 210. In this embodiment, for example, the light-shielding layer 400 may function as a pixel-defining layer. The light-shielding layer 400 may include an absorbance material. The absorbance material may be a polymer material including carbon black and an organic insulating material.

The light-shielding layer 400 that functions as the pixel-defining layer may include a first hole 400OP that corresponds to the transmission part TA and second holes 401OP that correspond to each emission area EA of each of display elements, i.e., OLEDs of each of the first, second, and third pixels P1, P2, and P3.

The width of the first hole 400OP may be less than that of the first opening 117OP of the planarization layer 117. The width of the third opening 230OP of the opposite electrode 230 may be greater than the width of the first hole 400OP and the width of the first opening 117OP of the planarization layer 117. Sides of the planarization layer 117 for defining the first opening 117OP of the planarization layer 117 may be covered with the light-shielding layer 400 including an absorbance material.

According to one or more embodiments, a display device may prevent light from being diffracted through a fine gap between circuits provided in each pixel and thus may provide a high-quality image and may prevent image distortion due to a sensor area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details and scope may be made therein without departing from the spirit and scope as defined by the following claims.

What is claimed is:

1. A display device including a display area and a sensor area which includes a transmission part, the display device comprising:
   a substrate;
   a plurality of display elements disposed on the substrate and comprising a first display element and a second display element spaced apart from each other with the transmission part therebetween;
   a plurality of pixel circuits comprising a first pixel circuit electrically connected to the first display element and a second pixel circuit electrically connected to the second display element; and
   a light-shielding layer comprising a part overlapping the first pixel circuit and the second pixel circuit, the light-shielding layer includes a hole corresponding to the transmission part,
   wherein a width of the hole of the light-shielding layer is less than a separation distance between the first display element and the second display element, and
   at least one of the plurality of display elements is positioned in the sensor area.

2. The display device of claim 1, wherein the hole of the light-shielding layer overlaps the transmission part.

3. The display device of claim 1, further comprising an encapsulation layer disposed to cover the light-shielding layer.

4. The display device of claim 3, wherein the encapsulation layer includes inorganic encapsulation layers and an organic encapsulation layer between the inorganic encapsulation layers.

5. The display device of claim 3, further comprising an insulating layer on the substrate, and the light-shielding layer is between the insulating layer and the encapsulation layer.

6. The display device of claim 1, further comprising a protective film that includes an opening corresponding to the sensor area.

7. The display device of claim 1, wherein
   the substrate comprises a first polymer resin layer and a second polymer resin layer, and
   the light-shielding layer is between the first polymer resin layer and the second polymer resin layer.

8. The display device of claim 1, further comprising a buffer layer, and the light-shielding layer is between the substrate and the buffer layer.

9. The display device of claim 1, wherein
   the light-shielding layer is between the substrate and the plurality of pixel circuits.

10. The display device of claim 1, wherein
    the light-shielding layer comprises a conductive material.

11. The display device of claim 10, wherein
    the light-shielding layer is electrically connected to one among wirings applying voltages to the plurality of pixel circuits.

12. The display device of claim 11, wherein
    one among the wirings electrically connected to the light-shielding layer comprises an initialization voltage line or a power supply line.

13. The display device of claim 1, further comprising:
    a planarization layer on the plurality of pixel circuits and comprising an opening corresponding to the transmission part, wherein
    a width of the hole of the light-shielding layer is less than a width of the opening of the planarization layer.

14. The display device of claim 1, wherein
    the light-shielding layer covers an entirety of the first pixel circuit and the second pixel circuit.

15. The display device of claim 1, wherein
    the plurality of display elements each comprise a pixel electrode, an emission layer on the pixel electrode, and an opposite electrode on the emission layer, the opposite electrode is a single body corresponding to the plurality of display elements, and the opposite electrode comprises an opening corresponding to the transmission part.

16. The display device of claim 15, wherein the pixels are auxiliary pixels or main pixels or a combination of auxiliary and main pixels.

17. The display device of claim 16, wherein the main pixels are in the display area and the auxiliary pixels are in the sensor area and the transmission part is between the auxiliary and main pixels.

18. The display device of claim 17, wherein at least one auxiliary pixel is in an auxiliary pixel area of the sensor area and the sensor area further comprises a transmission area that includes the transmission part.

19. The display device of claim 18, wherein the auxiliary pixel area includes red, green, and blue emission areas.

20. The display device of claim 19, wherein the emission areas are Pentile or stripes.

21. The display device of claim 18, wherein the transmission part is of a rectangular shape or substantially circular in shape.

22. The display device of claim 1, wherein the hole of the light-shielding layer defines the transmission part.

23. The display device of claim 1, wherein
the light-shielding layer comprises an absorbance material.

24. The display device of claim 1, further comprising
a component disposed under the substrate corresponding to the sensor area and comprising an electronic element that emits or receives light.

25. A display device including a display area and a sensor area which includes a transmission part, the display device comprising:
a substrate;
a plurality of display elements disposed on the substrate and comprising a first display element and a second display element spaced apart from each other with the transmission part therebetween;
a light-shielding layer comprising a first hole corresponding to the transmission part;
a component disposed in the sensor area; and
an encapsulation layer on the plurality of display elements and overlapping the light-shielding layer,
wherein the encapsulation layer includes inorganic encapsulation layers and an organic encapsulation layer between the inorganic encapsulation layers.

26. The display device of claim 25, further comprising:
a first pixel circuit electrically connected to the first display element and a second pixel circuit electrically connected to the second display element; and
a planarization layer between the first pixel circuit and the first display element and between the second pixel circuit and the second display element,
wherein the planarization layer comprises an opening corresponding to the transmission part.

27. The display device of claim 26, wherein
each of the display elements comprises a pixel electrode, an emission layer on the pixel electrode, and an opposite electrode on the emission layer,
the light-shielding layer is between a pixel electrode of each of the display elements and an emission layer of each of the display elements and includes openings that overlap the pixel electrodes, and
a width of a first hole of the light-shielding layer is less than a width of the opening of the planarization layer.

28. The display device of claim 27, wherein
the light-shielding layer comprises carbon black.

29. The display device of claim 27, wherein the opposite electrode is a single body corresponding to the display elements, and the opposite electrode comprises an opening corresponding to the transmission part.

30. The display device of claim 29, wherein a width of the first hole of the light-shielding layer is less than that of the opening of the opposite electrode or the planarization layer.

31. The display device of claim 26, further comprising a pixel defining layer on the planarization layer, and the pixel defining layer comprises an opening corresponding to the transmission part.

32. The display device of claim 31, wherein
the light-shielding layer is electrically connected to a wiring that applies voltages to at least one of the plurality of pixel circuits.

33. The display device of claim 25, further comprising:
a plurality of pixel circuits comprising a first pixel circuit electrically connected to the first display element and a second pixel circuit electrically connected to the second display element, wherein
the light-shielding layer is between the substrate and the first pixel circuit and between the substrate and the second pixel circuit.

34. The display device of claim 33, wherein
the light-shielding layer comprises a conductive material.

35. The display device of claim 25, wherein
at least one of the plurality of display elements overlaps the component.

* * * * *